(12) United States Patent
Xu et al.

(10) Patent No.: US 12,520,538 B2
(45) Date of Patent: Jan. 6, 2026

(54) RARE-EARTH DOPED SEMICONDUCTOR MATERIAL, THIN-FILM TRANSISTOR, AND APPLICATION

(71) Applicant: SOUTH CHINA UNIVERSITY OF TECHNOLOGY, Guangdong (CN)

(72) Inventors: Miao Xu, Guangdong (CN); Hua Xu, Guangdong (CN); Min Li, Guangdong (CN); Junbiao Peng, Guangdong (CN); Lei Wang, Guangdong (CN); Jian Hua Zou, Guangdong (CN); Hong Tao, Guangdong (CN)

(73) Assignee: South China University of Technology, Guangzhou (CN)

( * ) Notice: Subject to any disclaimer, the term of this patent is extended or adjusted under 35 U.S.C. 154(b) by 455 days.

(21) Appl. No.: 17/994,022

(22) Filed: Nov. 25, 2022

(65) Prior Publication Data

US 2023/0094925 A1 Mar. 30, 2023

Related U.S. Application Data

(63) Continuation-in-part of application No. 17/158,026, filed on Jan. 26, 2021, now Pat. No. 11,545,581,
(Continued)

(30) Foreign Application Priority Data

Apr. 10, 2017 (CN) .......................... 201710229199.9
Nov. 20, 2020 (CN) .......................... 202011314502.3

(51) Int. Cl.
*H01L 21/00* (2006.01)
*H01L 21/02* (2006.01)
(Continued)

(52) U.S. Cl.
CPC ... *H10D 30/6756* (2025.01); *H01L 21/02422* (2013.01); *H01L 21/02554* (2013.01); *H01L 21/02581* (2013.01); *H01L 23/15* (2013.01)

(58) Field of Classification Search
CPC .......... H10D 30/6756; H10D 30/6755; H10D 99/00; H01L 21/02422; H01L 21/02554;
(Continued)

(56) References Cited

U.S. PATENT DOCUMENTS

2005/0017302 A1* 1/2005 Hoffman ............... H10D 30/751
438/149
2005/0039670 A1* 2/2005 Hosono ................... C30B 29/22
257/E29.147
(Continued)

FOREIGN PATENT DOCUMENTS

CN 103325840 B 5/2016
CN 104282576 B 6/2017

*Primary Examiner* — Sheikh Maruf

(57) ABSTRACT

Disclosed in the present invention is a rare-earth doped semiconductor material. Compounds of two rare-earth elements R and R' having different functions are introduced into an indium oxide containing material. The coupling of R element ions to an O2p orbit can effectively enhance the transfer efficiency of the rare-earth R' as a photogenerated electron transfer center, such that the light stability of a device with a small amount of R' doping can be achieved. Compared with single rare-earth element R' doping, due to less doping, the impact on a mobility is less, such that higher mobility and light stability devices can be obtained. Further provided in the present invention is a semiconductor-based thin-film transistor, and an application.

4 Claims, 6 Drawing Sheets

Related U.S. Application Data which is a continuation-in-part of application No. 16/529,833, filed on Aug. 2, 2019, now Pat. No. 11,677,031, which is a continuation of application No. PCT/CN2017/111109, filed on Nov. 15, 2017.

(51) Int. Cl.
*H01L 23/15* (2006.01)
*H10D 30/67* (2025.01)

(58) Field of Classification Search
CPC ............... H01L 21/02581; H01L 23/15; H01L 21/02488; H01L 21/02565; H01L 21/02631; H01L 21/30604; H01L 21/32134
USPC .......................................................... 257/43
See application file for complete search history.

(56) References Cited

U.S. PATENT DOCUMENTS

| | | | |
|---|---|---|---|
| 2005/0199959 A1* | 9/2005 | Chiang | H10D 30/6739 257/368 |
| 2006/0091793 A1* | 5/2006 | Baude | H10K 59/123 313/506 |
| 2006/0108529 A1* | 5/2006 | Saito | H10F 39/189 257/E31.093 |
| 2008/0308796 A1* | 12/2008 | Akimoto | H01L 29/78693 257/E29.296 |
| 2009/0294764 A1* | 12/2009 | Kim | H01L 29/78693 252/512 |
| 2012/0012835 A1* | 1/2012 | Herman | H01L 21/02565 257/E29.296 |
| 2012/0049183 A1* | 3/2012 | Yamazaki | H10D 62/402 204/192.15 |
| 2012/0060750 A1* | 3/2012 | Yamazaki | C23C 14/541 117/88 |
| 2012/0161125 A1* | 6/2012 | Yamazaki | H10D 99/00 257/E21.409 |
| 2012/0187395 A1* | 7/2012 | Koezuka | H01L 29/66969 257/E29.296 |
| 2013/0009219 A1* | 1/2013 | Yamazaki | H01L 29/7869 257/E21.409 |
| 2013/0104495 A1* | 5/2013 | Wiercinski | E04B 1/665 428/141 |
| 2013/0200375 A1* | 8/2013 | Yamazaki | H01L 21/0237 438/479 |
| 2013/0320330 A1* | 12/2013 | Yamazaki | H01L 29/045 257/43 |
| 2016/0218224 A1* | 7/2016 | Ota | H01L 21/30604 |
| 2016/0293641 A1* | 10/2016 | Sato | H01L 21/465 |
| 2017/0170332 A1* | 6/2017 | Yamazaki | H01L 27/1225 |
| 2017/0263783 A1* | 9/2017 | Yamazaki | H01L 29/786 |
| 2018/0006124 A1* | 1/2018 | Murakawa | H01L 29/66969 |
| 2018/0012739 A1* | 1/2018 | Yamazaki | C04B 35/453 |
| 2018/0012910 A1* | 1/2018 | Yamazaki | H01L 27/1225 |
| 2018/0114838 A1* | 4/2018 | Endo | H01L 29/4908 |
| 2019/0035937 A1* | 1/2019 | Yamazaki | H01L 29/78618 |

\* cited by examiner

RARE-EARTH DOPED SEMICONDUCTOR MATERIAL, THIN-FILM TRANSISTOR, AND APPLICATION

CROSS-REFERENCE TO RELATED APPLICATIONS

The present application is a continuation-in-part of U.S. patent application Ser. No. 17/158,026 filed on Jan. 26, 2021, which is a continuation-in-part of U.S. patent application Ser. No. 16/529,833 filed on Aug. 2, 2019, which is a continuation application of PCT application No. PCT/CN2017/111109 filed on Nov. 15, 2017, which claims the benefit of Chinese Patent Application No. 201710229199.9 filed on Apr. 10, 2017. U.S. patent application Ser. No. 17/158,026 also claims the benefit of Chinese Patent Application No. 202011314502.3 filed on Nov. 20, 2020. The contents of all of the aforementioned applications are incorporated by reference herein in their entirety.

TECHNICAL FIELD

The present invention relates to the field of semiconductor manufacturing, in particular, to a material and device structure used for manufacturing backboards of Metal Oxide (MO) semiconductor thin-film transistors in flat panel display and detector applications, and specifically, to a rare-earth doped semiconductor material, a thin-film transistor, and an application.

BACKGROUND

In a current MO semiconductor system, since indium ions ($In^{3+}$) have relatively large ionic radii, there is a higher probability of orbital overlap in multi-element MO, so as to ensure an efficient carrier transmission channel. A 5 s orbit is a main electron transport channel. However, in an aspect, since the bond-breaking energy of In—O is relatively low after indium-oxygen bonding, there are a large number of oxygen vacancy defects in a pure indium oxide ($In_2O_3$) thin-film. Oxygen vacancies are the main cause of stability degradation of a MO thin-film transistor. In another aspect, there are more lattice mismatches in a conventional sputtered indium oxide film, resulting in relatively low carrier mobility of the thin-film and limitations in application in the high-performance thin-film transistor. Generally, $Ga^{3+}$ ions of which number is equivalent to that of $In^{3+}$ ions are required to be doped, so as to regulate and control the oxygen vacancies. In addition, in order to guarantee the performance uniformity of a semiconductor device, the MO semiconductor thin-film is required to maintain an amorphous thin-film structure.

Since there is a large difference between a crystal structure of ZnO and crystal structures of $In_2O_3$ and $Ga_2O_3$, material crystallization can be prevented by doping a certain amount of Zn ions in the thin-film, so as to cause the thin-film to be of an amorphous structure. Therefore, the most widely used MO semiconductor material at present is indium gallium zinc oxide (IGZO, In:Ga:Zn=1:1:1 mol).

However, the IGZO also has some problems: the large addition of $Ga^{3+}$ and $Zn^{2+}$ ions greatly dilutes the concentration of $In^{3+}$, such that the overlap degree of the 5 s orbit can be reduced, thereby reducing electron mobility.

In addition, materials such as IGZO have a large number of trap states near the valence band. As a result, photogenerated carriers are generated even when the light energy is below the forbidden band width, resulting in poor light stability of the current MO semiconductor thin-film.

SUMMARY

In order to overcome the disadvantages of the prior art, the present invention provides a rare-earth doped semiconductor material with relatively high mobility and strong light stability, which is a new co-doping strategy. By means of using the special 4f electron orbital characteristics of rare-earth elements, in a thin-film with high In content (In's atomic ratio is greater than or equal to 50%), and a semiconductor thin-film with high mobility, controlled carrier concentration, and strong light stability can be obtained.

The new co-doping strategy of the present invention is to simultaneously introduce compounds of two rare-earth elements R and R' having different functions into an indium oxide containing material. In an aspect, the bond-breaking enthalpy change of the rare-earth element R and oxygen is relatively high ($\Delta Hf$ 298), where Sm—O(573 kJ/mol), Eu—O(473 kJ/mol), Dy(514 kJ/mol), Yb(387.7 kJ/mol), which are all greater than the bond-breaking enthalpy change of In—O(360 kJ/mol), such that the oxygen vacancy concentration in an indium oxide host material can be effectively controlled. In another aspect, the rare-earth element R simultaneously can show ions with two chemical valence states in the semiconductor material, which are respectively valence states of +2 and +3. When the quantity of +3-valent ions is greater than +2-valent ions in the rare-earth element, a deep defect level close to the valence band can be formed in a band gap, and the doping of the rare-earth element has no significant impact on the carrier mobility of the material. In addition, since a 4f electron structure of the rare-earth element R' interacts with a 5 s orbit of indium, a photogenerated carrier transfer center is formed in the band gap. Further, the rare-earth element R' also simultaneously shows ions with two chemical valence states in the semiconductor material, which are respectively valence states of +3 and +4. When the quantity of +4-valent ions is greater than +3-valent ions in the rare-earth element (for example, the ratio is greater than 1.2), a shallow defect level near the conduction band can be formed in the band gap, such that the effect of the photogenerated carrier transfer center can be achieved more efficiently, but the doping of the rare-earth element has larger impact on the carrier mobility of the material. When the two rare-earth elements R and R' are simultaneously doped into the host material, due to the coupling of R element ions to the O2p orbit, the transfer efficiency of the rare-earth R' as a photogenerated electron transfer center can be effectively enhanced, such that the light stability of a device with a small amount of R' doping can be achieved. Compared with single rare-earth element R' doping, due to less doping, the impact on the mobility is can be ignored, such that higher mobility and light stability devices can be obtained.

The second objective of the present invention is to provide a thin-film transistor including the rare-earth doped semiconductor material.

The third objective of the present invention is to provide an application of the thin-film transistor.

The present invention is implemented by means of the following technical solutions.

Provided is a rare-earth doped semiconductor material. The semiconductor material is that, compounds of at least two rare-earth elements R and R' are respectively doped into an indium oxide containing material, so as to form an $In_aM_bR_mR'_nD_c$ semiconductor material, where $0.5 \leq a < 0.9999$, $0 \leq b < 0.5$, $0.0001 \leq (m+n) \leq 0.1$, $a+b+m+n=1$, $m>0$, $n>0$, and $c>0$.

The rare-earth element R is one of samarium, europium, thulium or ytterbium or a combination of any two or more of the above materials.

The rare-earth element R' is one of praseodymium or terbium or a combination of the above two materials.

Preferably, in the $In_aM_bR_mR'_nD_c$ semiconductor material, D is an oxygen element.

Preferably, in the $In_aM_bR_m R'_nD_c$ semiconductor material, D is an oxygen element and additionally includes one of fluorine, chlorine, sulfur, selenium, tellurium, bromine, or iodine or a combination of any two or more of the above.

Preferably, in the $In_aM_bR_m R'_nD_c$ semiconductor material, D is an oxygen element and additionally comprises one of boron, carbon, nitrogen, silicon, or phosphorus or a combination of any two or more of the above.

In order to better achieve the doping of the rare-earth elements, by means of introducing some rare-earth compounds, the doping efficiency and dispersibility of the rare-earth elements in the host material can be effectively improved. Different thin-film preparation modes involved herein may select different doping methods.

Preferably, in the $In_aM_bR_m R'_nD_c$ semiconductor material, M is one of Zn, Ga, Sn, Ge, Sb, Mg, Ti, Zr, Hf, Ta, or W or a combination of any two or more of the above materials.

Preferably, in the $In_aM_bR_m R'_nD_c$ semiconductor material, $0.001 \leq (m+n) \leq 0.05$, and m/n is greater than 1.0.

Preferably, in the $In_aM_bR_m R'_nD_c$ semiconductor material, the valence state of the ion compound of R is +2 and +3; and the valence state of the ion compound of R' is +3 and +4.

Preferably, in the $In_aM_bR_m R'_nD_c$ semiconductor material, the ratio of the quantity of +3-valent ions to the quantity of +2-valent ions in the ion compound of R is greater than 1.0; and the ratio of the quantity of +4-valent ions to the quantity of +3-valent ions in the ion compound of R' is greater than 1.2.

Simultaneously provided in the present invention is a rare-earth doped semiconductor thin-film, which is prepared by means of any one of a physical vapor deposition process, an atomic layer deposition process, or a solution process or a combination of the above two processes.

In current large-scale mass production, thin-films are usually prepared by means of physical vapor deposition, which is also known as magnetron sputtering. This deposition mode has the advantages of low-temperature preparation and large-scale preparation, and is mature in technology. In the present invention, by means of doping a certain amount of rare-earth compound in a sputtering target material, the expected thin-film can be prepared. In addition, the thin-film prepared by means of atomic layer deposition process has the characteristics of being compact and low in defects. In the present invention, by means of atomic layer deposition, the prepared thin-film is accurate and controllable in doping amount, and has remarkable advantages in controlling the doping of rare-earth elements. Furthermore, the solution method has the advantage of low cost and high efficiency for the preparation of thin-films. In the present invention, by means of using compounds such as rare-earth fluoride or chloride, the valence state of rare earth can be effectively controlled, so as to obtain the expected semiconductor thin-film.

It is particularly noted that, the film preparation method of the present invention may be a combination of the above methods. For example, a thin-film is first deposited by means of atomic layer deposition; and then a thin-film covering the above thin-film is prepared by means of physical vapor deposition, so as to prepare the rare-earth doped semiconductor thin-film of the present invention.

The present invention further provides a thin-film transistor. The thin-film transistor includes a gate electrode, an active layer, an insulation layer located between the gate electrode and the active layer, a source electrode and a drain electrode that are respectively electrically connected to two ends of the active layer, and a spacing layer. The active layer is the rare-earth doped semiconductor thin-film.

The thin-film transistor is applied to a display panel, a flexible electronic component, or a detector.

Compared with the prior art, the present invention has the following beneficial effects.

In the present invention, by means of a new co-doping strategy, compounds of two rare-earth elements R and R' having different functions are simultaneously introduced into an indium oxide containing material. Since the rare-earth element R shows ions with two chemical valence states in the semiconductor material, which are respectively valence states of +2 and +3, a deep defect level close to the valence band can be formed in a band gap, and the doping of the rare-earth element has no significant impact on the carrier mobility of the material. The rare-earth element R' also shows ions with two chemical valence states in the semiconductor material, which are respectively valence states of +3 and +4, a shallow defect level close to the conduction band can be formed in the band gap, and the doping of the rare-earth element has large impact on the carrier mobility of the material. When the two rare-earth elements R and R' are simultaneously doped into the host material, due to the coupling of R element ions to the O2p orbit, the transfer efficiency of the rare-earth R' as a photo-generated electron transfer center can be effectively enhanced, such that the light stability of a device with a small amount of R' doping can be achieved. Compared with single rare-earth element R' doping, due to less doping, the impact on the mobility is can be ignored, such that higher mobility and light stability devices can be obtained.

Figure 1:
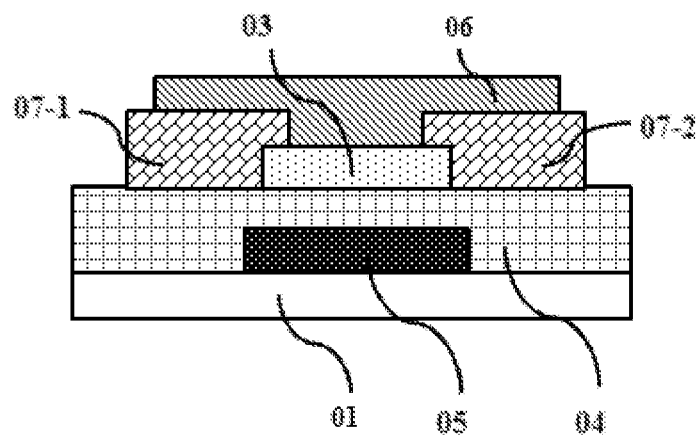
FIG. 1 is a schematic structural diagram of a thin-film transistor according to Embodiment 9, Embodiment 10, Embodiment 27 or Embodiment 28.

In the drawings: 01, Substrate; 02, Buffer layer; 03, Channel layer; 04, Insulation layer; 05, Gate electrode; 06, Spacing layer; 07-1, Source electrode; 07-2, Drain electrode; 08, Etch stop layer.

DETAILED DESCRIPTION OF THE EMBODIMENTS

The present invention is further described below with reference to the accompanying drawings and specific embodiments. It is to be noted that, without conflict, new embodiments can be formed by any combination between the embodiments described below or between the technical features.

The following are specific embodiments of the present invention, and the raw materials and devices used in the following embodiments can be obtained by means of purchase, except for special limitations.

Embodiment 1: Praseodymium Oxide and Europium Oxide Doped Indium Tin Zinc Oxide (InSnZnO) Semiconductor Material Provided is a group of MO semiconductor materials, the group of MO semiconductor materials is that, praseodymium oxide is doped into InSnZnO as a charge transfer center, and europium oxide is doped as a carrier control agent, so as to form a praseodymium oxide and europium oxide co-doped InSnZnO (Pr—Eu:InSnZnO) semiconductor material.

MO is tin-zinc oxide, where In:Sn:Zn=3:1:1 mol, which is marked as In(3)Sn(1)Zn(1); and in $Inx(SnZn)_yEu_nPr_mO_z$, x=0.5, y=0.3333, m=0.05, and n=0.1167. But not limited to the above ratio, in some other embodiments, x=0.53, y=0.353, m=0.05, and n=0.067, or x=0.56, y=0.373, m=0.05, and n=0.017, or x=0.58, y=0.387, m=0.03, and n=0.003, which are not described herein again.

It is to be noted that, praseodymium in the semiconductor material includes oxide with the valence state of +4/+3, and europium includes oxide with the valence state of +3/+2. The ratio of the quantity of +4-valent ions ($Pr^{4+}$) to the quantity of +3-valent ions ($Pr^{3+}$) is 1.5; and the ratio of the quantity of +3-valent ions ($Eu^{3+}$) to the quantity of +2-valent ions ($Eu^{2+}$) is 1.1.

Embodiment 2: Praseodymium Oxide and Ytterbium Oxide Co-Doped Indium Zinc Titanium Oxide (InZnTiO) Semiconductor Material Provided is a group of MO semiconductor materials, the group of MO semiconductor materials is that, praseodymium oxide is doped into InZnTiO as a charge transfer center, and ytterbium oxide is doped as a carrier control agent, so as to form a praseodymium oxide and ytterbium oxide co-doped InZnTiO (Pr—Yb:InZnTiO) semiconductor material.

MO is zinc titanium oxide, where In:Zn:Ti=4:1:0.05 mol, which is marked as In(4)Zn(1)Ti(0.05); and in $Inx(ZnTi)_yYb_nPr_mO_z$, x=0.75, y=0.1969, m=0.0031, and n=0.05. But not limited to the above ratio, in some other embodiments, x=0.7, y=0.1838, m=0.0662, and n=0.05, or x=0.65, y=0.17, m=0.13, and n=0.05, which are not described herein again.

It is to be noted that, praseodymium in the semiconductor material includes oxide with the valence state of +4/+3, and ytterbium includes oxide with the valence state of +3/+2. The ratio of the quantity of +4-valent ions ($Pr^{4+}$) to the number of +3-valent ions ($Pr^{3+}$) is 1.8; and the ratio of the quantity of +3-valent ions ($Yb^{3+}$) to the quantity of +2-valent ions ($Yb^{2+}$) is 1.2.

Embodiment 3: Terbium Oxide and Europium Oxide Co-Doped Indium Gallium Zinc Oxide (InGaZnO) Semiconductor Material Provided is a group of MO semiconductor materials, the group of MO semiconductor materials is that, terbium oxide is doped into InGaZnO as a charge transfer center, and europium oxide is doped as a carrier control agent, so as to form a terbium oxide and europium oxide co-doped InGaZnO (Tb—Eu:InGaZnO) semiconductor material.

MO is gallium zinc oxide, where In:Ga:Zn=4:0.5:1 mol, which is marked as In(4)Ga(0.5)Zn(1); and in $Inx(GaZn)_yEu_nTb_mO_z$, x=0.65, y=0.2438, m=0.05, and n=0.0562. But not limited to the above ratio, in some other embodiments, x=0.55, y=0.2053, m=0.05, and n=0.1937, or x=0.58, y=0.2175, m=0.05, and n=0.1525, or x=0.6, y=0.225, m=0.05, and n=0.125, which are not described herein again.

It is to be noted that, terbium in the semiconductor material includes oxide with the valence state of +4/+3, and europium includes oxide with the valence state of +3/+2. The ratio of the quantity of +4-valent ions ($Tb^{4+}$) to the quantity of +3-valent ions ($Tb^{3+}$) is 2.5; and the ratio of the quantity of +3-valent ions ($Eu^{3+}$) to the quantity of +2-valent ions ($Eu^{2+}$) is 1.5.

Embodiment 4: Terbium Oxide and Ytterbium Oxide Co-Doped Indium Gallium Zirconium Oxide (InGaZrO) Semiconductor Material Provided is a group of MO semiconductor materials, the group of MO semiconductor materials is that, terbium oxide is doped into InGaZrO as a charge transfer center, and ytterbium oxide is doped as a carrier control agent, so as to form a terbium oxide and ytterbium oxide co-doped InGaZrO (Tb—Yb:InGaZrO) semiconductor material.

MO is gallium zirconium oxide, where In:Ga:Zr=5:1:0.05 mol, which is marked as In(5)Ga(1)Zr(0.05); and in Inx $(GaZr)_yYb_nTb_mO_z$, x=0.7, y=0.147, m=0.103, and n=0.05. But not limited to the above ratio, in some other embodiments, x=0.65, y=0.1365, m=0.1635, and n=0.05, or x=0.63, y=0.1323, m=0.1877, and n=0.05, or x=0.74, y=0.1554, m=0.0546, and n=0.05, which are not described herein again.

It is to be noted that, terbium in the semiconductor material includes oxide with the valence state of +4/+3, and ytterbium includes oxide with the valence state of +3/+2. The ratio of the terbium of +4-valent ions ($Tb^{4+}$) to the terbium of +3-valent ions ($Tb^{3+}$) is 2.5; and the ratio of the ytterbium of +3-valent ions ($Yb^{3+}$) to the ytterbium of +2-valent ions ($Yb^{2+}$) is 1.5.

Embodiment 5: Praseodymium Oxide and Europium Oxide Co-Doped InSnZnO Thin-Film Provided is a group of MO semiconductor thin-films, the group of MO semiconductor thin-films is formed by the praseodymium oxide and europium oxide co-doped InSnZnO semiconductor material of Embodiment 1 by means of magnetron sputtering.

Embodiment 6: Praseodymium Oxide and Ytterbium Oxide Co-Doped InZnTiO Thin-Film

Provided is a group of MO semiconductor thin-films, the group of MO semiconductor thin-films is formed by the praseodymium oxide and ytterbium oxide co-doped InZnTiO semiconductor material of Embodiment 2 by means of magnetron sputtering.

Embodiment 7: Terbium Oxide and Europium Oxide Co-Doped InGaZnO Thin-Film

Provided is a group of MO semiconductor thin-films, the group of MO semiconductor thin-films is prepared by the terbium oxide and europium oxide co-doped InGaZnO semiconductor material of Embodiment 3 by means of magnetron sputtering.

Embodiment 8: Terbium Oxide and Ytterbium Oxide Co-Doped InGaZrO Thin-Film

Provided is a group of MO semiconductor thin-films, the group of MO semiconductor thin-films is prepared by the terbium oxide and ytterbium oxide co-doped InGaZrO semiconductor material of Embodiment 4 by means of magnetron sputtering.

Embodiment 9: Thin-Film Transistor

A group of thin-film transistors uses a back channel etched structure, of which schematic structural diagram is shown in FIG. 1. The thin-film transistor is provided with a substrate 01, a gate electrode 05 located on the substrate 01, an insulation layer 04 located on the substrate 01 and the gate electrode 05, a channel layer 03 covering an upper surface of the insulation layer 04 and corresponding to the gate electrode 05, a source electrode 07-1 and a drain electrode 07-2 that are spaced apart from each other and electrically connected to two ends of the channel layer 03, and a spacing layer 06.

The substrate 01 is a rigid alkali-free glass substrate, which is covered with a buffer layer 02 silicon oxide.

A material of the gate electrode 05 is of a Molybdenum/Copper (Mo/Cu) laminated structure prepared by means of magnetron sputtering, with a thickness of 20/400 nm.

The insulation layer 04 is a laminated layer of Silicon Nitride ($Si_3N_4$) and Silicon Oxide ($SiO_2$) prepared by means of chemical vapor deposition, with a thickness of 250/50 nm. The Si3N4 is at the bottom layer and is in contact with the gate electrode 05, and the $SiO_2$ is at the upper layer and is in contact with the channel layer 03.

In order to test the impact of different praseodymium oxide content on the performance of a device, a material of the channel layer 03 is the praseodymium oxide and europium oxide co-doped indium tin zinc oxide semiconductor material of Embodiment 1. By means of using three ceramic target of InSnZnO, europium oxide doped InSnZnO (Eu:InSnZnO) and praseodymium oxide and europium oxide co-doped InSnZnO (Pr—Eu:InSnZnO), and using a single target or co-sputtering of two targets, thin-films with different component proportions can be prepared by adjusting the sputtering power of two target.

Materials of the source electrode 07-1 and the drain electrode 07-2 are of the Molybdenum/Copper (Mo/Cu) laminated structures, which have a thickness of 20/400 nm. The materials are patterned by using a commercial hydrogen peroxide-based etching solution which has less damage to the channel layer 03 and has no obvious etching residue.

A material of the spacing layer 06 is $SiO_2$ prepared by means of chemical vapor deposition, with a thickness of 300 nm; and a deposition temperature is 250° C.

The thin-film transistor of this embodiment may be an enclosed structure that only includes the substrate 01, the gate electrode 05, the insulation layer 04, the channel layer 03, the source electrode 07-1, the drain electrode 07-2, and the spacing layer 06, or may further include a planarization layer, a reflective electrode, a pixel definition layer, and the like, or may also be integrated with other devices.

The patterning process of the thin-film is performed by means of photolithography, in combination with a wet or dry etching method.

Specific parameters in this embodiment and the device performance of the prepared thin-film transistor are shown in Table 1. The photogenerated current characteristic is characterized by irradiating the channel layer 03 of the device of the thin-film transistor with a commercial white LED light source electrode (luminous intensity being set to 10000 nits). By means of evaluating the transfer characteristics of the device with or without light, the changes in the threshold voltage and subthreshold swing of the device are extracted, so as to evaluate the photogenerated current characteristics. Large changes in the threshold voltage indicate strong photogenerated current characteristics, otherwise the opposite.

TABLE 1

| | Test | 1 | 2 | 3 | 4 | 5 | 6 | 7 | 8 |
|---|---|---|---|---|---|---|---|---|---|
| Praseodymium atom content | m | 0 | 0 | 0.0001 | 0.0010 | 0.0100 | 0.0500 | 0.1000 | 0.1500 |
| Europium atom content | n | 0 | 0.0500 | | | 0.0500 | | | |
| Channel layer deposition conditions | Deposition mode | | | | Magnetron sputtering | | | | |
| | $O_2/(Ar + O_2)(\%)$ | | | | 20 | | | | |
| | Sputtering pressure (Pa) | | | | 0.5 | | | | |
| | Substrate temperature (° C.) | | | | RT | | | | |

TABLE 1-continued

| Test | | 1 | 2 | 3 | 4 | 5 | 6 | 7 | 8 |
|---|---|---|---|---|---|---|---|---|---|
| Channel layer processing | Atmosphere annealing processing | | | | Air-350° C. | | | | |
| Other film layer composition | Substrate | | | | Glass | | | | |
| | Buffer layer | | | | $SiO_2$ | | | | |
| | Gate electrode | | | | Mo/Cu | | | | |
| | Gate electrode insulation layer | | | | $Si_3N_4/SiO_2$ | | | | |
| | Source electrode/drain electrode | | | | Mo/Cu | | | | |
| | Spacing layer | | | | $SiO_2$ | | | | |
| Spacing layer post-processing | Atmosphere annealing processing | | | | Air-300° C. | | | | |
| Thin-film performance | Carrier concentration n ($cm^{-3}$) | 5.00E+19 | 4.20E+18 | 4.00E+18 | 3.50E+18 | 2.80E+18 | 8.40E+17 | 3.10E+17 | 8.00E+16 |
| Device performance | Threshold voltage $V_{th}$(V) | / | −5.3 | −4.8 | −4.2 | −1.4 | 0.2 | 2.6 | 4.1 |
| | Mobility μ ($cm^2V^{-1}S^{-1}$) | / | 40.6 | 38.4 | 34.8 | 30.5 | 25.7 | 12.2 | 3.5 |
| | Subthreshold swing SS (V/decade) | / | 0.14 | 0.14 | 0.16 | 0.18 | 0.25 | 0.34 | 0.46 |
| | Current switching ratio $I_{on}/I_{off}$ | / | $10^9$ | $10^9$ | $10^9$ | $10^9$ | $10^9$ | $10^8$ | $10^7$ |
| | Electrical stability | / | Poor | Poorer | Good | Excellent | Excellent | Excellent | Excellent |
| | Photogenerated current characteristic | / | Extremely strong | Strong | Stronger | Weak | Weak | Weak | Weak |

Note:
MO in this embodiment is tin-zinc oxide, where In/Sn/Zn = 3/1/1 (mol); and indicates that the device has no switching characteristics.

It can be learned from Table 1 that, the doping of praseodymium oxide and europium oxide has remarkable impact on the performance of the device. First, as shown in Test 1 in Table 1, the device prepared by InSnZnO undoped with the praseodymium oxide (m=0) and the europium oxide (n=0) does not show a "switching" characteristic (it is in normal on state) of the thin-film transistor, which indicates that the carrier concentration in the thin-film is too high. As shown in Test 2 in Table 1, after a certain amount (corresponding to m=0, n=0.05) of europium oxide is doped, the device shows the "switching" characteristic, referring to view (a) in FIG. 4 for details, it indicates that the doping of the europium oxide can effectively inhibit the carrier concentration in the thin film. Corresponding thin film Hall data is shown in Table 1. Further, as shown in Test 2 to 8 in Table 1, by means of adjusting the sputtering power of the target during co-sputtering, a series of devices with different praseodymium content can be prepared. It is to be noted that, the device (corresponding to m=0, n=0.05) undoped with the praseodymium oxide has relatively high mobility, small subthreshold swing and negative threshold voltage, but has the extremely strong photogenerated current characteristic. That is to say, under the condition of light irradiation, the characteristics of the device are remarkably changed (the threshold voltage is negatively drifted, and the subthreshold swing is severely degraded). However, after a certain amount of praseodymium oxide is doped, the photogenerated current characteristic of the device is obviously inhibited. As the content of the praseodymium oxide increases, the characteristics of the device, such as mobility, are further degraded, such that the photogenerated current characteristic is further improved. When excessive praseodymium oxide is doped (for example, m=0.15, n=0.05), the mobility of the device is obviously degraded. Although the photogenerated current characteristic of the device is extremely weak, the application of the device is limited. Therefore, the relationship between the mobility and the photogenerated current characteristic needs to be balanced in a practical application, so as to select an appropriate doping amount.

Figure 4:
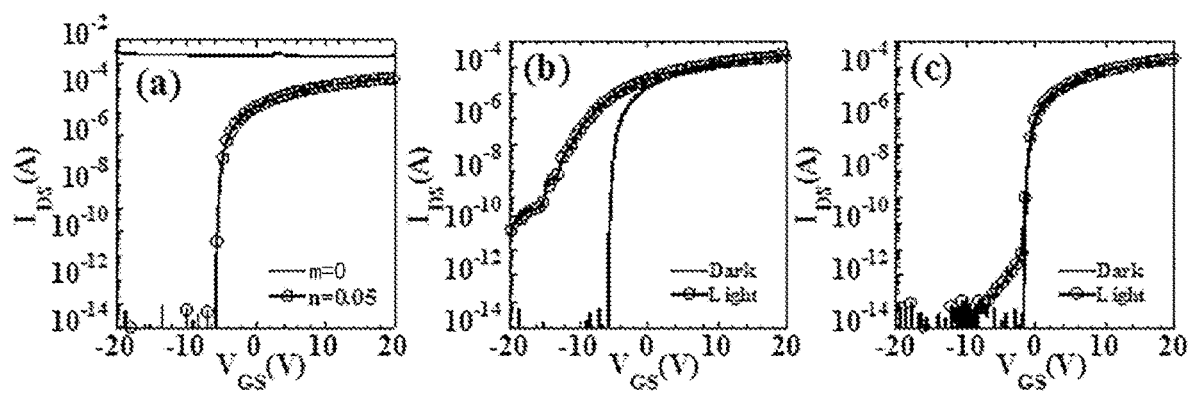
FIG. 4 is a transfer characteristic and photogenerated current characteristic diagram of a device according to Embodiment 9.

The prepared device in this embodiment is tested for the corresponding photogenerated current characteristic, as shown in view (b) in FIG. 4 and view (c) in FIG. 4, corresponding m values are respectively 0 and 0.05. When there is light irradiated on the device, the threshold voltage of the device (corresponding to m=0, n=0.05) undoped with the praseodymium oxide is significantly negatively shifted, and the subthreshold swing is severely degraded. After a certain amount of praseodymium oxide is doped (corresponding to m=0.05, n=0.05), the threshold voltage of the device is almost unchanged. Therefore, excellent light stability is shown, that is, corresponding to weak photogenerated current characteristic in Table 1.

Test results of this embodiment show that, in the present invention, in the InSnZnO material, the carrier concentration of the material can be effectively controlled by doping a certain amount of praseodymium oxide and europium oxide, thereby improving the light stability.

Embodiment 10: Thin-Film Transistor

A group of thin-film transistors uses a back channel etched structure, of which schematic structural diagram is shown in FIG. 1. The thin-film transistor is provided with a substrate 01, a gate electrode 05 located on the substrate 01, an insulation layer 04 located on the substrate 01 and the gate electrode 05, a channel layer 03 covering an upper surface of the insulation layer 04 and corresponding to the gate electrode 05, a source electrode 07-1 and a drain electrode 07-2 that are spaced apart from each other and electrically connected to two ends of the channel layer 03, and a spacing layer 06.

The substrate 01 is a rigid alkali-free glass substrate, which is covered with a buffer layer 02 silicon oxide.

A material of the gate electrode 05 is of a Mo/Cu laminated structure prepared by means of magnetron sputtering, with a thickness of 20/400 nm.

The insulation layer 04 is a laminated layer of $Si_3N_4$ and $SiO_2$ prepared by means of chemical vapor deposition, with a thickness of 250/50 nm. The Si3N4 is at the bottom layer and is in contact with the gate electrode 05, and the $SiO_2$ is at the upper layer and is in contact with the channel layer 03.

In order to test the impact of different ytterbium oxide content on the performance of a device, a material of the channel layer 03 is the praseodymium oxide and ytterbium oxide doped InZnTiO semiconductor material of Embodiment 2. By means of using three ceramic targets of InZnTiO, praseodymium oxide doped InZnTiO (Pr:InZnTiO) and praseodymium oxide and ytterbium oxide co-doped InZnTiO (Pr—Yb:InZnTiO), and using a single target or co-sputtering of two targets, thin-films with different component proportions can be prepared by adjusting the sputtering power of two targets.

Materials of the source electrode 07-1 and the drain electrode 07-2 are of the Mo/Cu laminated structures, which have a thickness of 20/400 nm. The materials are patterned by using a commercial hydrogen peroxide-based etching solution which has less damage to the channel layer 03 and has no obvious etching residue.

A material of the spacing layer 06 is $SiO_2$ prepared by means of chemical vapor deposition, with a thickness of 300 nm; and a deposition temperature is 250° C.

The thin-film transistor of this embodiment may be an enclosed structure that only includes the substrate 01, the gate electrode 05, the insulation layer 04, the channel layer 03, the source electrode 07-1, the drain electrode 07-2, and the spacing layer 06, or may further include a planarization layer, a reflective electrode, a pixel definition layer, and the like, or may also be integrated with other devices.

The patterning process of the thin-film is performed by means of photolithography, in combination with a wet or dry etching method.

Specific parameters in this embodiment and the device performance of the prepared thin-film transistor are shown in Table 2. The photogenerated current characteristic is characterized by irradiating the channel layer 03 of the device of the thin-film transistor with a commercial white LED light source electrode (luminous intensity being set to 10000 nits). By means of evaluating the transfer characteristics of the device with or without light, the changes in the threshold voltage and subthreshold swing of the device are extracted, so as to evaluate the photogenerated current characteristics. Large changes in the threshold voltage indicate strong photogenerated current characteristics, otherwise the opposite.

TABLE 2

| | Test | 1 | 2 | 3 | 4 | 5 | 6 | 7 | 8 |
|---|---|---|---|---|---|---|---|---|---|
| Praseodymium atom content | m | 0 | 0.0500 | | | | 0.0500 | | |
| Ytterbium atom content | n | 0 | 0 | 0.0001 | 0.0010 | 0.0100 | 0.0500 | 0.1000 | 0.1500 |
| Channel layer deposition conditions | Deposition mode | | | | Magnetron sputtering | | | | |
| | $O_2/(Ar + O_2)$(%) | | | | 30 | | | | |
| | Sputtering pressure (Pa) | | | | 0.3 | | | | |
| | Substrate temperature (° C.) | | | | RT | | | | |
| Channel layer processing | Atmosphere annealing processing | | | | Air-350° C. | | | | |
| Other film layer composition | Base layer | | | | Glass | | | | |
| | Buffer layer | | | | $SiO_2$ | | | | |
| | Gate electrode | | | | Mo/Cu | | | | |
| | Gate electrode insulation layer | | | | $Si_3N_4/SiO_2$ | | | | |
| | Source electrode/drain electrode | | | | Mo/Cu | | | | |
| | Spacing layer | | | | $SiO_2$ | | | | |
| Spacing layer post-processing | Atmosphere annealing processing | | | | Air-300° C. | | | | |
| Thin-film performance | Carrier concentration n (cm$^{-3}$) | 3.30E+19 | 2.10E+19 | 9.30E+18 | 7.50E+18 | 5.20E+18 | 8.50E+17 | 2.40E+17 | 6.60E+17 |
| Device performance | Threshold voltage $V_{th}$ (V) | / | / | −15.8 | −6.2 | −1.2 | 0.5 | 2.8 | 5.2 |
| | Mobility μ (cm$^2$V$^{-1}$S$^{-1}$) | / | / | 56.3 | 48.6 | 36.2 | 30.7 | 15.2 | 6.5 |

TABLE 2-continued

| Test | 1 | 2 | 3 | 4 | 5 | 6 | 7 | 8 |
|---|---|---|---|---|---|---|---|---|
| Subthreshold swing SS (V/decade) | / | / | 0.34 | 0.14 | 0.19 | 0.23 | 0.36 | 0.53 |
| Current switching ratio $I_{on}/I_{off}$ | / | / | $10^8$ | $10^9$ | $10^9$ | $10^9$ | $10^8$ | $10^7$ |
| Electrical stability | / | / | Poorer | Poor | Excellent | Excellent | Excellent | Excellent |
| Photogenerated current characteristic | / | / | Weak | Weak | Weak | Weak | Weak | Weak |

Note:
MO in this embodiment is zinc titanium oxide, where In/Zn/Ti = 4/1/0.05 (mol); and indicates that the device has no switching characteristics.

It can be learned from Table 2 that, the doping of praseodymium oxide and ytterbium oxide has remarkable impact on the performance of the device. First, as shown in Test 2 in Table 1, the device prepared by InZnTiO undoped with the praseodymium oxide (m=0) and the ytterbium oxide (n=0) does not show a "switching" characteristic (it is on state) of the thin-film transistor, which indicates that the carrier concentration in the thin-film is too high. After a certain amount (corresponding to m=0, n=0.001) of ytterbium oxide is doped, the device shows the "switching" characteristic, referring to view (a) in FIG. 5 for details, it indicates that the doping of the ytterbium oxide can effectively inhibit the carrier concentration in the thin film. As shown in Test 2 in Table 2, after a certain amount (corresponding to m=0.05, n=0) of praseodymium oxide is doped, the device still does not show the "switching" characteristic. Further, when a certain amount of ytterbium oxide is continuously doped (corresponding to m=0.05, n=0.0001), the device shows the "switching" characteristic. Therefore, it indicates that the praseodymium oxide is not as effective as the ytterbium oxide in inhibiting the carrier concentration in the thin film. Corresponding thin film Hall data is shown in Table 2. In order to further study the impact of the ytterbium oxide, as shown in Test 2 to 8 in Table 2, by means of adjusting the sputtering power of the target during co-sputtering, a series of devices with different ytterbium content can be prepared. Specifically, the device (corresponding to m=0.05, n=0.0001) doped with a small amount of ytterbium oxide has relatively high mobility and negative threshold voltage. As the content of the ytterbium oxide increases, the threshold voltage of the device is positively shifted, and the mobility decreases gradually. Therefore, it indicates that the ytterbium oxide can effectively regulate and control the threshold voltage of the device. That is to say, the carrier concentration in the thin film can be effectively regulated and controlled, which may be further certified from Hall data in Table 2. However, after excessive ytterbium oxide is doped (for example, m=0.05, n=0.15), the mobility of the device is obviously degraded, which greatly limits the application of the device. Therefore, the relationship between the mobility and the photogenerated current characteristic needs to be balanced in a practical application, so as to select an appropriate doping amount.

Figure 5:
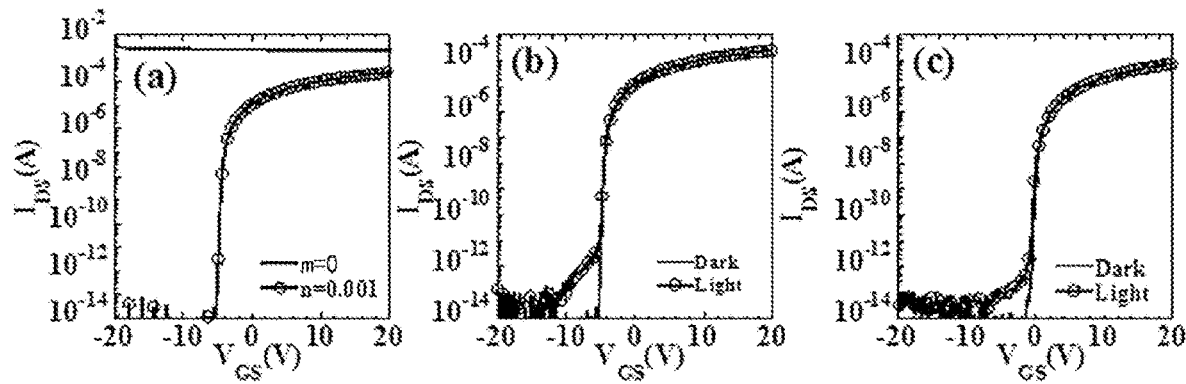
FIG. 5 is a transfer characteristic and photogenerated current characteristic diagram of a device according to Embodiment 10.

The prepared device in this embodiment is tested for the corresponding photogenerated current characteristic, as shown in view (b) in FIG. 5 and view (c) in FIG. 5, corresponding m values are all 0.05, and n values are respectively 0.001 and 0.05. When there is light irradiated on the device, the threshold voltage of the device (corresponding to m=0.05, n=0.001) doped with a small amount of ytterbium oxide is not obviously shifted, and the subthreshold swing is slightly degraded. In addition, after a certain amount of ytterbium oxide is doped (corresponding to m=0.05, n=0.05), the threshold voltage of the device is almost unchanged, which shows excellent light stability, that is, corresponding to weak photogenerated current characteristic in Table 2. It is to be noted that, the photogenerated current characteristics of the device under different ytterbium content (m=0.05, n=0-0.15) are relatively weak, indicating that the doping of the praseodymium oxide can effectively improve the light stability of the device.

Test results of this embodiment show that, in the present invention, in the InZnTiO material, the carrier concentration of the material can be effectively controlled by doping a certain amount of praseodymium oxide and ytterbium oxide, thereby improving the light stability.

Embodiment 11: Thin-Film Transistor

Figure 2:
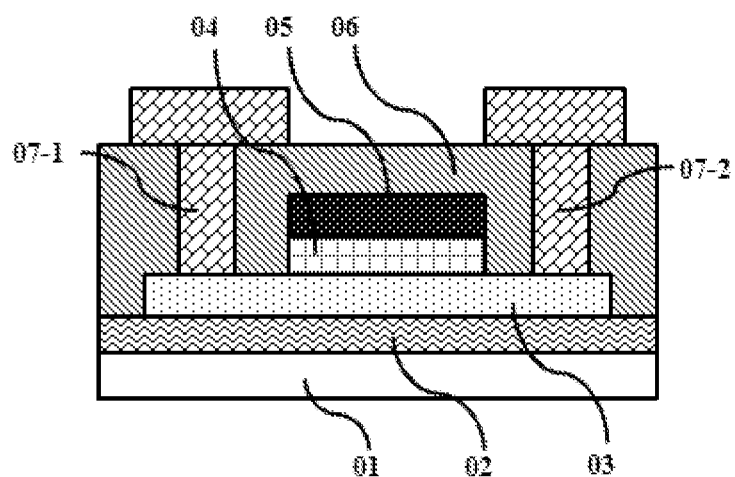
FIG. 2 is a schematic structural diagram of a thin-film transistor according to Embodiment 11, Embodiment 12, or Embodiment 29.

A group of thin-film transistors uses a top gate electrode self-aligning structure, of which schematic structural diagram is shown in FIG. 2. The thin-film transistor is provided with a substrate 01, a buffer layer 02, a gate electrode 03, an insulation layer 04 and a gate electrode 05 that are located above the channel layer 03, a spacing layer 06 covering upper surfaces of the channel layer 03 and the gate electrode, and a source electrode 07-1 and a drain electrode 07-2 above the spacing layer 06 and electrically connected to two ends of the channel layer 03.

The substrate 01 is a rigid glass substrate.

The buffer layer 02 is $SiO_2$ prepared by means of plasma enhanced chemical vapor deposition.

A material of the channel layer 03 is the terbium oxide and europium oxide co-doped indium gallium zinc oxide semiconductor material of Embodiment 3, with a thickness of 30 nm.

The insulation layer 04 is $SiO_2$, with a thickness of 300 nm. The gate electrode 05 is of a Titanium/Copper (Ti/Cu) laminated structure prepared by means of magnetron sputtering, with a thickness of 20/400 nm.

The spacing layer 06 is $SiO_2$, with a thickness of 300 nm. Materials of the source electrode 07-1 and the drain electrode 07-2 are of the Ti/Cu laminated structure prepared by means of magnetron sputtering, with a thickness of 20/400 nm.

In order to test the impact of different europium oxide content on the performance of the device, the material of the channel layer 03 is the terbium oxide and europium oxide co-doped InGaZnO semiconductor material of Embodiment 3. By means of using three ceramic targets of InGaZnO, terbium oxide doped InGaZnO (Tb:InGaZnO) and terbium oxide and europium oxide co-doped InGaZnO (Tb—Eu:InGaZnO), and using a single target or co-sputtering of two targets, thin-films with different component proportions can be prepared by adjusting the sputtering power of two targets.

The thin-film transistor of this embodiment may be an enclosed structure that only includes the substrate 01, the channel layer 03, the insulation layer 04, the gate electrode 05, the spacing layer 06, the source electrode 07-1 and the drain electrode 07-2, or may further include a passivation layer, a pixel definition layer, and the like, or may also be integrated with other devices.

The patterning of the thin-film is performed by means of photolithography, in combination with a wet or dry etching method.

Specific parameters in this embodiment and the device performance of the prepared thin-film transistor are shown in Table 3. The photogenerated current characteristic is characterized by irradiating the channel layer of the device of the thin-film transistor with a commercial white LED light source. By means of characterizing the transfer characteristics of the device under different light intensity conditions, the changes in the threshold voltage of the device are extracted, so as to evaluate the photogenerated current characteristics. Large changes in the threshold voltage indicate strong photogenerated current characteristics, otherwise the opposite.

TABLE 3

| | Test | 1 | 2 | 3 | 4 | 5 | 6 | 7 | 8 |
|---|---|---|---|---|---|---|---|---|---|
| Terbium atom content | m | 0 | 0.0500 | | | 0.0500 | | | |
| Europium atom content | n | 0 | 0 | 0.0001 | 0.0010 | 0.0100 | 0.0500 | 0.1000 | 0.1500 |
| Channel layer deposition conditions | Deposition mode | | | | Magnetron sputtering | | | | |
| | $O_2/(Ar + O_2)(\%)$ | | | | 20 | | | | |
| | Sputtering pressure (Pa) | | | | 0.3 | | | | |
| | Substrate temperature (° C.) | | | | RT | | | | |
| Channel layer processing | Atmosphere annealing processing | | | | Air-350° C. | | | | |
| Other film layer composition | Base layer | | | | Glass | | | | |
| | Buffer layer | | | | $Si_3N_4SiO_2$ | | | | |
| | Gate electrode insulation layer | | | | $SiO_2$ | | | | |
| | Gate electrode | | | | Ti/Cu | | | | |
| | Spacing layer | | | | $SiO_2$ | | | | |
| | Source electrode/drain electrode | | | | Ti/Cu | | | | |
| Spacing layer post-processing | Atmosphere annealing processing | | | | Air-300° C. | | | | |
| Thin-film performance | Carrier concentration n ($cm^{-3}$) | 2.60E+19 | 1.00E+19 | 9.10E+18 | 5.00E+18 | 1.20E+18 | 5.40E+17 | 8.30E+16 | 2.02E+16 |
| Device performance | Threshold voltage $V_{th}$ (V) | / | / | −14.8 | −5.2 | −0.6 | 0.8 | 3.6 | 6.4 |
| | Mobility μ ($cm^2V^{-1}s^{-1}$) | / | / | 55.6 | 36.8 | 26.3 | 20.2 | 8.2 | 1.5 |
| | Subthreshold swing SS (V/decade) | / | / | 0.43 | 0.22 | 0.29 | 0.33 | 0.38 | 0.55 |
| | Current switching ratio $I_{on}/I_{off}$ | / | / | $10^8$ | $10^9$ | $10^9$ | $10^9$ | $10^8$ | $10^7$ |
| | Electrical stability | / | / | Poorer | Poor | Excellent | Excellent | Excellent | Excellent |
| | Photogenerated current characteristic | / | / | Weak | Weak | Weak | Weak | Weak | Weak |

Note:
MO in this embodiment is gallium zinc oxide, where In/Ga/Zn = 4/0.5/1 (mol); and indicates that the device has no switching characteristics.

Figure 6:
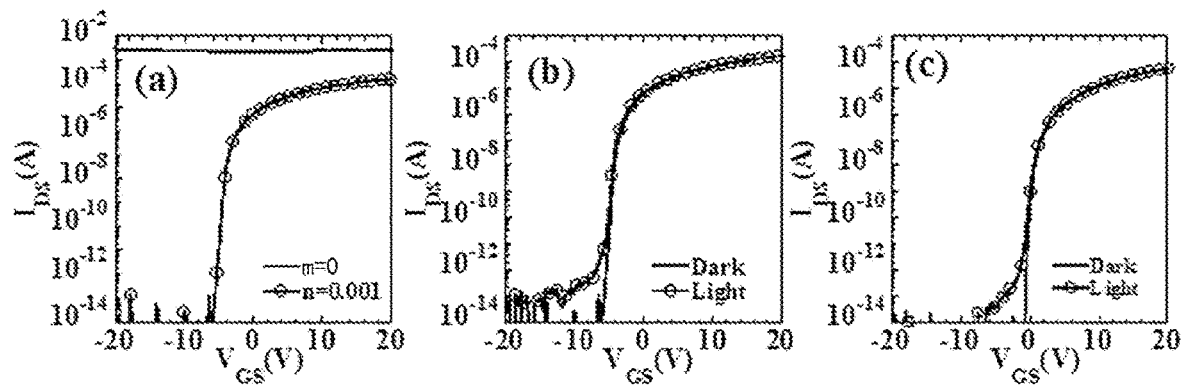
FIG. 6 is a transfer characteristic and photogenerated current characteristic diagram of a device according to Embodiment 11.

It can be learned from Table 3 that, the doping of terbium oxide and europium oxide has remarkable impact on the performance of the device. First, as shown in Test 3 in Table 1, the device prepared by InGaZnO undoped with the terbium oxide (m=0) and the europium oxide (n=0) does not show a "switching" characteristic (it is on state) of the thin-film transistor, which indicates that the carrier concentration in the thin-film is too high. After a certain amount (corresponding to m=0, n=0.001) of europium oxide is doped, the device shows the "switching" characteristic, referring to view (a) in FIG. 6 for details, it indicates that the doping of the europium oxide can effectively inhibit the carrier concentration in the thin film. As shown in Test 2 in Table 3, after a certain amount (corresponding to m=0.05, n=0) of terbium oxide is doped, the device still does not show the "switching" characteristic. Further, when a certain amount of europium oxide is continuously doped (corresponding to m=0.05, n=0.0001), the device shows the "switching" characteristic. Therefore, it indicates that the terbium oxide is not as effective as the europium oxide in inhibiting the carrier concentration in the thin film. Corresponding thin film Hall data is shown in Table 3. In order to further study the impact of the europium oxide, as shown in Test 2 to 8 in Table 3, by means of adjusting the sputtering power of the targets during co-sputtering, a series of devices with different europium content can be prepared. Specifically, the device (corresponding to m=0.05, n=0.0001) doped with a small amount of europium oxide has relatively high mobility and negative threshold voltage. As the content of the europium oxide increases, the threshold voltage of the device is positively shifted, and the mobility decreases gradually. Therefore, it indicates that the europium oxide can effectively regulate and control the threshold voltage of the device. That is to say, the carrier concentration in the thin-film can be effectively regulated and controlled, which may be further certified from Hall data in Table 3. However, after excessive europium oxide is doped (for example, m=0.05, n=0.15), the mobility of the device is obviously degraded, which greatly limits the application of the device. Therefore, the relationship between the mobility and the photogenerated current characteristic needs to be balanced in a practical application, so as to select an appropriate doping amount. The prepared device in this embodiment is tested for the corresponding photogenerated current characteristic, as shown in view (b) in FIG. 6, view (c) in FIG. 6, corresponding m values are all 0.05, and n values are respectively 0.001 and 0.05. When there is light irradiated on the device, the threshold voltage of the device (corresponding to m=0.05, n=0.001) doped with a small amount of europium oxide is not obviously shifted, and the subthreshold swing is slightly degraded. In addition, after a certain amount of europium oxide is doped (corresponding to m=0.05, n=0.05), the threshold voltage of the device is almost unchanged, which shows excellent light stability, that is, corresponding to weak photogenerated current characteristic in Table 3. It is to be noted that, the photogenerated current characteristics of the device under different europium content (m=0.05, n=0-0.15) are relatively weak, indicating that the doping of the terbium oxide can effectively improve the light stability of the device.

Test results of this embodiment show that, in the present invention, in the InGaZnO material, the carrier concentration of the material can be effectively controlled by doping a certain amount of terbium oxide and europium oxide, thereby improving the light stability.

Embodiment 12: Thin-Film Transistor

A group of thin-film transistors uses a top gate self-aligning structure, of which schematic structural diagram is shown in FIG. 2. The thin-film transistor is provided with a substrate 01, a buffer layer 02, a gate electrode 03, an insulation layer 04 and a gate electrode 05 that are located above the channel layer 03, a spacing layer 06 covering upper surfaces of the channel layer 03 and the gate electrode, and a source electrode 07-1 and a drain electrode 07-2 above the spacing layer 06 and electrically connected to two ends of the channel layer 03.

The substrate 01 is a rigid glass substrate.

The buffer layer 02 is $SiO_2$ prepared by means of plasma enhanced chemical vapor deposition.

A material of the channel layer 03 is the terbium oxide and ytterbium oxide co-doped indium gallium zirconium oxide semiconductor material of Embodiment 4, with a thickness of 30 nm.

The insulation layer 04 is $SiO_2$, with a thickness of 300 nm. The gate electrode 05 is of a Ti/Cu laminated structure prepared by means of magnetron sputtering, with a thickness of 20/400 nm.

The spacing layer 06 is $SiO_2$, with a thickness of 300 nm.

Materials of the source electrode 07-1 and the drain electrode 07-2 are of the Ti/Cu laminated structure prepared by means of magnetron sputtering, with a thickness of 20/400 nm.

In order to test the impact of different terbium oxide content on the performance of the device, the material of the channel layer 03 is the terbium oxide and ytterbium oxide co-doped InGaZrO semiconductor material of Embodiment 4. By means of using three ceramic targets of InGaZrO, terbium oxide doped InGaZrO (Tb:InGaZrO) and terbium oxide and ytterbium oxide co-doped InGaZrO (Tb—Yb:InGaZrO), and using a single target or co-sputtering of two targets, thin-films with different component proportions can be prepared by adjusting the sputtering power of two targets.

The thin-film transistor of this embodiment may be an enclosed structure that only includes the substrate 01, the channel layer 03, the insulation layer 04, the gate electrode 05, the spacing layer 06, the source electrode 07-1 and the drain electrode 07-2, or may further include a passivation layer, a pixel definition layer, and the like, or may also be integrated with other devices.

The patterning of the thin-film is performed by means of photolithography, in combination with a wet or dry etching method.

Specific parameters in this embodiment and the device performance of the prepared thin-film transistor are shown in Table 4. The photogenerated current characteristic is characterized by irradiating the channel layer 03 of the device of the thin-film transistor with a commercial white LED light source. By means of characterizing the transfer characteristics of the device under different light intensity conditions, the changes in the threshold voltage of the device are extracted, so as to evaluate the photogenerated current characteristics. Large changes in the threshold voltage indicate strong photogenerated current characteristics, otherwise the opposite.

TABLE 4

| Test | | 1 | 2 | 3 | 4 | 5 | 6 | 7 | 8 |
|---|---|---|---|---|---|---|---|---|---|
| Terbium atom content | m | 0 | 0 | 0.0001 | 0.0010 | 0.0100 | 0.0500 | 0.1000 | 0.1500 |
| Ytterbium atom content | n | 0 | 0.0500 | | | 0.0500 | | | |
| Channel layer deposition conditions | Deposition mode | | | | Magnetron sputtering | | | | |
| | $O_2/(Ar + O_2)(\%)$ | | | | 30 | | | | |
| | Sputtering pressure (Pa) | | | | 0.5 | | | | |
| | Substrate temperature (° C.) | | | | RT | | | | |
| Channel layer processing | Atmosphere annealing processing | | | | Air-350° C. | | | | |
| Other film layer composition | Base layer | | | | Glass | | | | |
| | Buffer layer | | | | $Si_3N_4/SiO_2$ | | | | |
| | Gate insulation layer | | | | $SiO_2$ | | | | |
| | Gate electrode | | | | Ti/Cu | | | | |
| | Spacing layer | | | | $SiO_2$ | | | | |
| | Source electrode/drain electrode | | | | Ti/Cu | | | | |
| Spacing layer post-processing | Atmosphere annealing processing | | | | Air-300° C. | | | | |
| Thin-film performance | Carrier concentration n ($cm^{-3}$) | 8.00E+19 | 7.20E+18 | 7.00E+18 | 6.50E+18 | 4.80E+18 | 1.20E+18 | 5.10E+17 | 8.50E+16 |
| Device performance | Threshold voltage $V_{th}$ (V) | / | −6.3 | −5.8 | −5.2 | −2.4 | 0.1 | 1.6 | 3.1 |
| | Mobility $\mu$ ($cm^2 V^{-1} S^{-1}$) | / | 45.6 | 40.5 | 38.8 | 32.5 | 28.7 | 14.2 | 6.5 |
| | Subthreshold swing SS (V/decade) | / | 0.12 | 0.12 | 0.13 | 0.15 | 0.24 | 0.32 | 0.45 |
| | Current switching ratio $I_{on}/I_{off}$ | / | $10^9$ | $10^9$ | $10^9$ | $10^9$ | $10^9$ | $10^8$ | $10^7$ |
| | Electrical stability | / | Poor | Poorer | Good | Excellent | Excellent | Excellent | Excellent |
| | Photogenerated current characteristic | / | Extremely strong | Strong | Stronger | Weak | Weak | Weak | Weak |

Note:
MO in this embodiment is gallium zirconium oxide, where In/Ga/Zr = 5/1/0.05 (mol); and indicates that the device has no switching characteristics.

It can be learned from Table 4 that, the doping of terbium oxide and ytterbium oxide has remarkable impact on the performance of the device. First, as shown in Test 4 in Table 1, the device prepared by InGaZrO undoped with the terbium oxide (m=0) and the ytterbium oxide (n=0) does not show a "switching" characteristic (it is on state) of the thin-film transistor, which indicates that the carrier concentration in the thin-film is too high. As shown in Test 2 in Table 4, after a certain amount (corresponding to m=0, n=0.05) of ytterbium oxide is doped, the device shows the "switching" characteristic, referring to view (a) in FIG. 7 for details, it indicates that the doping of the ytterbium oxide can effectively inhibit the carrier concentration in the thin-film. Corresponding thin-film Hall data is shown in Table 4. Further, as shown in Test 2 to 8 in Table 4, by means of adjusting the sputtering power of the targets during co-sputtering, a series of devices with different terbium content can be prepared. It is to be noted that, the device (corresponding to m=0, n=0.05) undoped with the terbium oxide has relatively high mobility, small subthreshold swing and negative threshold voltage, but has the extremely strong photogenerated current characteristic. That is to say, under the condition of light irradiation, the characteristics of the device are remarkably changed (the threshold voltage is negatively drifted, and the subthreshold swing is severely degraded). However, after a certain amount of terbium oxide is doped, the photogenerated current characteristic of the device is obviously inhibited. As the content of the terbium oxide increases, the characteristics of the device, such as mobility, are further degraded, such that the photogenerated current characteristic is further improved. When excessive terbium oxide is doped (for example, m=0.15, n=0.05), the mobility of the device is obviously degraded. Although the photogenerated current characteristic of the device is extremely weak, the application of the device is limited. Therefore, the relationship between the mobility and the photogenerated current characteristic needs to be balanced in a practical application, so as to select an appropriate doping amount.

Figure 7:
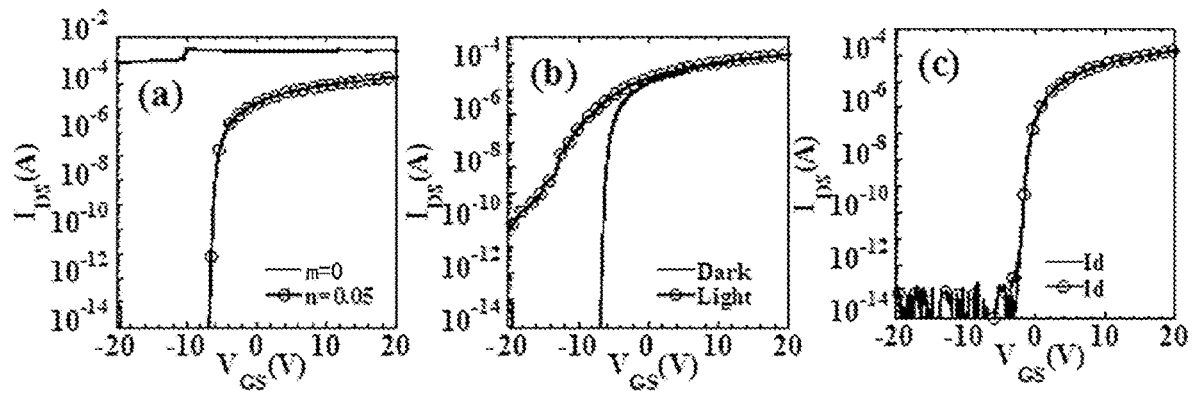
FIG. 7 is a transfer characteristic and photogenerated current characteristic diagram of a device according to Embodiment 12.

The prepared device in this embodiment is tested for the corresponding photogenerated current characteristic, as shown in view (b) in FIG. 7 and view (c) in FIG. 7, corresponding n values are all 0.05, and m values are respectively 0 and 0.05. When there is light irradiated on the device, the threshold voltage of the device (corresponding to m=0, n=0.05) undoped with the terbium oxide is significantly negatively shifted, and the subthreshold swing is severely degraded. After a certain amount of terbium oxide is doped (corresponding to m=0.05, n=0.05), the threshold voltage of the device is almost unchanged. Therefore, excellent light stability is shown, that is, corresponding to weak photogenerated current characteristic in Table 4.

Test results of this embodiment show that, in the present invention, in the InGaZrO material, the carrier concentration of the material can be effectively controlled by doping a certain amount of terbium oxide and ytterbium oxide, thereby improving the light stability.

Embodiment 13: Praseodymium Oxide and Samarium Oxide Doped InGaZnO Semiconductor Material Provided is a group of MO semiconductor materials. The group of $In_aM_bRm\ R'_nD_c$ semiconductor materials is that, praseodymium oxide and samarium oxide are simultaneously doped into InGaZnO; praseodymium includes oxide with the valence state of +4/+3; samarium includes oxide with the valence state of +3/+2; and a praseodymium oxide and samarium oxide co-doped InGaZnO (Pr—Sm:InGaZnO) semiconductor material is formed. The ratio of the quantity of +4-valent ions ($Pr^{4+}$) to the quantity of +3-valent ions ($Pr^{3+}$) is 1.5; and the ratio of the quantity of +3-valent ions ($Sm^{3+}$) to the quantity of +2-valent ions ($Sm^{2+}$) is 1.1.

In the semiconductor material $In_aM_bR_m\ R'_nD_c$, M is Gallium (Ga) and Zinc (Zn), where Ga:Zn=1:2 mol; D is oxygen; and a=0.675, b=0.3, m=0.015, and n=0.01. But not limited to the above ratio, in some other embodiments, a=0.585, b=0.4, m=0.010, and n=0.005, or a=0.75, b=0.2, m=0.03, and n=0.02, or a=0.83, b=0.1, m=0.05, and n=0.02, which are not described herein again.

Embodiment 14: Terbium Oxide and Ytterbium Oxide Co-Doped InGaZnO Semiconductor Material Provided is a group of MO semiconductor materials. The group of $In_aM_bR_m\ R'_nD_c$ semiconductor materials is that, terbium oxide and ytterbium oxide are simultaneously doped into InGaZnO; terbium includes oxide with the valence state of +4/+3; ytterbium includes oxide with the valence state of +3/+2; and a terbium oxide and ytterbium oxide co-doped InGaZnO (Tb—Yb:InGaZnO) semiconductor material is formed. The ratio of the quantity of +4-valent ions ($Tb^{4+}$) to the quantity of +3-valent ions ($Tb^{3+}$) is 1.4; and the ratio of the quantity of +3-valent ions ($Yb^{3+}$) to the quantity of +2-valent ions ($Yb^{2+}$) is 1.2.

In the semiconductor material $In_aM_bR_m\ R'_nD_c$, M is Gallium (Ga) and Zinc (Zn), where Ga:Zn=1:2 mol; D is oxygen; and a=0.778, b=0.2, m=0.012, and n=0.01. But not limited to the above ratio, in some other embodiments, a=0.589, b=0.4, m=0.006, and n=0.005, or a=0.585, b=0.4, m=0.012, and n=0.003, or a=0.59, b=0.4, m=0.009, and n=0.001, which are not described herein again.

Embodiment 15: Terbium Oxide and Europium Oxide Co-Doped Indium Zinc Oxide (InZnO) Semiconductor Material Provided is a group of MO semiconductor materials. The group of MO semiconductor materials is that, terbium oxide and europium oxide are simultaneously doped into InZnO; terbium includes oxide with the valence state of +4/+3; europium includes oxide with the valence state of +3/+2; and a terbium oxide and europium oxide co-doped InZnO (Tb—Eu:InZnO) semiconductor material is formed. The ratio of the quantity of +4-valent ions ($Tb^{4+}$) to the quantity of +3-valent ions ($Tb^{3+}$) is 1.5; and the ratio of the quantity of +3-valent ions ($Eu^{3+}$) to the quantity of +2-valent ions ($Eu^{2+}$) is 1.5.

In the semiconductor material $In_aM_bR_m\ R'_nD_c$, M is Zn; D is oxygen; and a=0.57, b=0.4, m=0.02, and n=0.01. But not limited to the above ratio, in some other embodiments, a=0.665, b=0.3, m=0.02, and n=0.015, or a=0.755, b=0.2, m=0.025, and n=0.02, or a=0.85, b=0.1, m=0.03, and n=0.02, which are not described herein again.

Embodiment 16: Praseodymium Oxide and Thulium Oxide Co-Doped InSnZnO Semiconductor Material Provided is a group of MO semiconductor materials. The group of MO semiconductor materials is that, praseodymium oxide and thulium oxide are simultaneously doped into InSnZnO; praseodymium includes oxide with the valence state of +4/+3; thulium includes oxide with the valence state of +3/+2; and a praseodymium oxide and thulium oxide co-doped InSnZnO (Pr—Tm:InSnZnO) semiconductor material is formed. The ratio of the quantity of +4-valent ions ($Pr^{4+}$) to the quantity of +3-valent ions ($Pr^{3+}$) is 1.8; and the ratio of the quantity of +3-valent ions ($Tm^{3+}$) to the quantity of +2-valent ions ($Tm^{2+}$) is 2.1.

In the semiconductor material $In_aM_bR_m\ R'_nD_c$, M is Sn and Zn, where Sn:Zn=1:2 mol; D is oxygen; and a=0.57, b=0.4, m=0.02, and n=0.01. But not limited to the above ratio, in some other embodiments, a=0.665, b=0.3, m=0.02, and n=0.015, or a=0.755, b=0.2, m=0.025, and n=0.02, or a=0.85, b=0.1, m=0.03, and n=0.02, which are not described herein again.

Embodiment 17: Praseodymium Oxide, Europium Oxide and Thulium Oxide Co-Doped InZnO Semiconductor Material Provided is a group of MO semiconductor materials. The group of MO semiconductor materials is that, praseodymium oxide, europium oxide and thulium oxide are simultaneously doped into InZnO; praseodymium includes oxide with the valence state of +4/+3; europium includes oxide with the valence state of +3/+2; thulium oxide includes oxide with the valence state of +3/+2; and a praseodymium oxide, europium oxide and thulium oxide co-doped InZnO (Pr—Eu—Tm:InZnO) semiconductor material is formed. The ratio of the quantity of +4-valent ions (Pr4+) to the quantity of +3-valent ions (Pr3+) is 1.5; the ratio of the quantity of +3-valent ions (Tm3+) to the quantity of +2-valent ions (Tm2+) is 1.2; and the ratio of the quantity of +3-valent ions ($Tm^{3+}$) to the quantity of +2-valent ions ($Tm^{2+}$) is 1.5.

In the semiconductor material $In_aM_bR_m\ R'_nD_c$, M is Zn; R is Eu and Tm, where Eu:Tm=1:1 mol; D is oxygen; and a=0.575, b=0.4, m=0.015, and n=0.01. But not limited to the above ratio, in some other embodiments, a=0.485, b=0.5, m=0.01, and n=0.005, or a=0.755, b=0.2, m=0.025, and n=0.02, or a=0.85, b=0.1, m=0.03, and n=0.02, which are not described herein again.

Embodiment 18: Praseodymium Fluoride and Ytterbium Fluoride Co-Doped InGaZnO Semiconductor Material Provided is a group of MO semiconductor materials. The group of $In_aM_bR_m\ R'_nD_c$ semiconductor materials is that, praseodymium fluoride and ytterbium fluoride are simultaneously doped into InGaZnO; praseodymium includes fluoride with the valence state of +4/+3; ytterbium includes fluoride with the valence state of +3/+2; and a praseodymium fluoride and ytterbium fluoride co-doped InGaZnO (PrF—YbF:InGaZnO) semiconductor material is formed. The ratio of the quantity of +4-valent ions ($Pr^{4+}$) to the quantity of +3-valent ions ($Pr^{3+}$) is 4.1; and the ratio of the quantity of +3-valent ions ($Yb^{3+}$) to the quantity of +2-valent ions ($Yb^{2+}$) is 2.5.

In the semiconductor material $In_aM_bR_m R'_nD_c$, M is Gallium (Ga) and Zinc (Zn), where Ga:Zn=1:3 mol; D is oxygen and fluorine; and a=0.778, b=0.2, m=0.012, and n=0.01. But not limited to the above ratio, in some other embodiments, a=0.58, b=0.4, m=0.015, and n=0.005, or a=0.585, b=0.4, m=0.012, and n=0.003, or a=0.59, b=0.4, m=0.009, and n=0.001, which are not described herein again.

Embodiment 19: Terbium Selenide and Ytterbium Selenide Co-Doped InGaZnO Semiconductor Material Provided is a group of MO semiconductor materials. The group of $In_aM_bR_m R'_nD_c$ semiconductor materials is that, terbium selenide and ytterbium selenide are simultaneously doped into InGaZnO; terbium includes selenide with the valence state of +4/+3; ytterbium includes selenide with the valence state of +3/+2; and a terbium selenide and ytterbium selenide co-doped InGaZnO (TbSe—YbSe:InGaZnO) semiconductor material is formed. The ratio of the quantity of +4-valent ions ($Tb^{4+}$) to the quantity of +3-valent ions ($Tb^{3+}$) is 10.3; and the ratio of the quantity of +3-valent ions ($Yb^{3+}$) to the quantity of +2-valent ions ($Yb^{2+}$) is 5.2.

In the semiconductor material $In_aM_bR_m R'_nD_c$, M is Gallium (Ga) and Zinc (Zn), where Ga:Zn=1:2 mol; D is oxygen and selenium; and a=0.778, b=0.2, m=0.012, and n=0.01. But not limited to the above ratio, in some other embodiments, a=0.58, b=0.4, m=0.015, and n=0.005, or a=0.585, b=0.4, m=0.012, and n=0.003, or a=0.59, b=0.4, m=0.009, and n=0.001, which are not described herein again.

Embodiment 20: Praseodymium Oxide and Samarium Oxide Doped InGaZnO Thin Film Provided is a group of MO semiconductor thin-films, the group of MO semiconductor thin films are formed by the praseodymium oxide and samarium oxide doped InGaZnO semiconductor material of Embodiment 13 by means of magnetron sputtering.

Embodiment 21: Terbium Oxide and Ytterbium Oxide Co-Doped InGaZnO Thin Film

Provided is a group of MO semiconductor thin films, the group of MO semiconductor thin films are formed by the terbium oxide and ytterbium oxide co-doped InGaZnO semiconductor material of Embodiment 14 by means of magnetron sputtering.

Embodiment 22: Terbium Oxide and Europium Oxide Co-Doped InZnO Thin-Film

Provided is a group of MO semiconductor thin films, the group of MO semiconductor thin films are prepared by the terbium oxide and europium oxide co-doped InZnO semiconductor material of Embodiment 15 by means of magnetron sputtering.

Embodiment 23: Praseodymium Oxide and Thulium Oxide Co-Doped InSnZnO Thin Film Provided is a group of MO semiconductor thin film, the group of MO semiconductor thin films are prepared by the terbium oxide and ytterbium oxide co-doped InSnZnO semiconductor material of Embodiment 16 by means of magnetron sputtering.

Embodiment 24: Praseodymium Oxide, Europium Oxide and Thulium Oxide Co-Doped InZnO Thin Film Provided is a group of MO semiconductor thin films, the group of MO semiconductor thin films are formed by the praseodymium oxide, europium oxide and thulium oxide co-doped InZnO semiconductor material of Embodiment 17 by means of atomic layer deposition.

Embodiment 25: Praseodymium Fluoride and Ytterbium Fluoride Co-Doped InGaZnO Thin Film Provided is a group of semiconductor thin films, the group of semiconductor thin films are prepared by the praseodymium fluoride and ytterbium fluoride co-doped InGaZnO semiconductor material of Embodiment 18 by means of a solution method.

Embodiment 26: Terbium Selenide and Ytterbium Selenide Co-Doped InGaZnO Thin Film Provided is a group of semiconductor thin films, the group of semiconductor thin films are prepared by the terbium selenide and ytterbium selenide co-doped InGaZnO semiconductor material of Embodiment 19 by means of a solution method.

Embodiment 27: Thin-Film Transistor

A group of thin-film transistors uses a back channel etched structure, of which schematic structural diagram is shown in FIG. 1. The thin-film transistor is provided with a substrate 01, a gate electrode 05 located on the substrate 01, an insulation layer 04 located on the substrate 01 and the gate electrode 05, a channel layer 03 covering an upper surface of the insulation layer 04 and corresponding to the gate electrode 05, a source electrode 07-1 and a drain electrode 07-2 that are spaced apart from each other and electrically connected to two ends of the channel layer 03, and a spacing layer 06.

The substrate 01 is a hard alkali-free glass substrate, which is covered with a buffer layer 02 silicon oxide.

A material of the gate electrode 05 is of a Mo/Cu laminated structure prepared by means of magnetron sputtering, with a thickness of 20/400 nm.

The insulation layer 04 is a laminated layer of $Si_3N_4$ and $SiO_2$ prepared by means of chemical vapor deposition, with a thickness of 250/50 nm. The $Si_3N_4$ is at the bottom layer and is in contact with the gate electrode 05, and the $SiO_2$ is at the upper layer and is in contact with the channel layer 03.

In order to test the impact of different components on the performance of the device, the material of the channel layer 03 is the praseodymium oxide and samarium oxide doped InGaZnO semiconductor material of Embodiment 13. By means of using four ceramic targets of InGaZnO, praseodymium oxide doped InGaZnO (Pr:InGaZnO), samarium oxide doped InGaZnO (Sm:InGaZnO) and praseodymium oxide and samarium oxide co-doped InGaZnO (Pr—Sm:InGaZnO), and using a single target or co-sputtering of two targets, thin-films with different component proportions can be prepared by adjusting the sputtering power of two targets.

Materials of the source electrode 07-1 and the drain electrode 07-2 are of the Mo/Cu laminated structures, which have a thickness of 20/400 nm. The materials are patterned by using a commercial hydrogen peroxide-based etching solution which has less damage to the channel layer 03 and has no obvious etching residue.

A material of the spacing layer 06 is $SiO_2$ prepared by means of chemical vapor deposition, with a thickness of 300 nm; and a deposition temperature is 250° C.

The thin-film transistor of this embodiment may be an enclosed structure that only includes the substrate 01, the gate electrode 05, the insulation layer 04, the channel layer 03, the source electrode 07-1, the drain electrode 07-2, and the spacing layer 06, or may further include a planarization layer, a reflective electrode, a pixel definition layer, and the like, or may also be integrated with other devices.

The patterning process of the thin-film is performed by means of photolithography, in combination with a wet or dry etching method.

The performance of the device of the thin-film transistor prepared in this embodiment is shown in Table 5. The light-heat Negative Bias characteristic (NBITS) of the device is characterized by irradiating the channel layer 03 of the device of the thin-film transistor with a commercial white LED light source electrode (luminous intensity being set to 10000 nits). A bias voltage applied to the gate electrode is −30V, and a temperature applied to the substrate is 60° C. By means of evaluating the transfer characteristic under an initial condition, and testing the transfer characteristic of the device after NBITS bias for a certain period of time, changes (Vth shift) in the threshold voltage of the device are extracted, so as to evaluate the strength and weakness of light stability. Large changes in the threshold voltage indicate poor light stability, otherwise the opposite.

and praseodymium oxide (n=0) has relatively high mobility (25.2 $cm^2$/Vs), but has relatively poor NBITS ($V_{th}$ shift=−8.5V), which indicates that the light stability of the device is relatively poor. By means of doping a certain amount of samarium oxide (corresponding to m=0.02, n=0), the change in the mobility of the device is little (24.5 $cm^2$/Vs), but the NBITS is still relatively poor ($V_{th}$ shift=−8.4V). Therefore, it indicates that the doping of the samarium oxide has little impact on the mobility of the device, but fails to improve the light stability of the device. After a certain amount of praseodymium oxide (corresponding to m=0, n=0.02) is doped, there is a large degradation in the mobility of the device (18.6 $cm^2$/Vs), but the NBITS is better ($V_{th}$ shift=−0.5V), which indicates that the light stability of the device is better. After a small amount of praseodymium oxide (corresponding to m=0, n=0.002) is doped, there is little impact on the mobility of the device (24.4 $cm^2$/Vs), but the NBITS of the device is still relatively poor ($V_{th}$ shift=−5.2V), which indicates that the light stability of the device is poor. It is to be noted that, when the doping amount of the samarium oxide is maintained to be consistent (m=0.02), and the doping amount of the praseodymium oxide is changed (n=0.02, 0.01, 0.005, 0.002), the device shows desirable light stability, and the mobility of the device is obviously improved. Therefore, it indicates that even if there is a small amount of praseodymium oxide is doped, the doping of the samarium oxide can effectively improve the light stability of the device, and the impact on the mobility of the device is relatively small.

Figure 8:
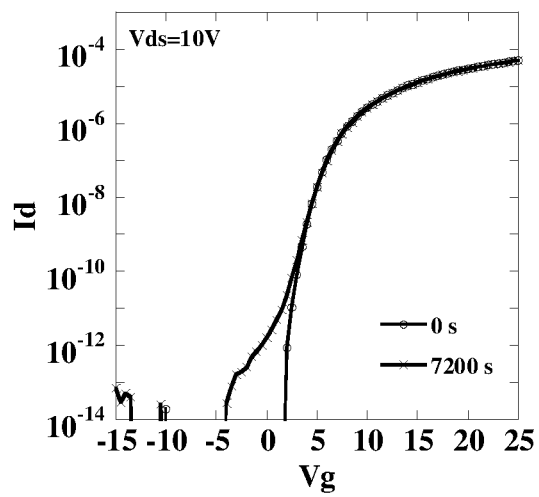
FIG. 8 is an NBITS characteristic diagram of light-heat stability of a device according to Embodiment 27.

Results of the light-heat bias stability NBITS of the device (corresponding to m=0.02, n=0.002) in this embodiment are shown in FIG. 8. After 7200 s of stress testing, the threshold voltage of the device is only negatively shifted by 0.4 V. Therefore, the device shows relatively high mobility and excellent light stability. Test results of this embodiment show that, in the InGaZnO material, by means of doping a certain amount of the praseodymium oxide with a specific proportion of bivalent state as a photogenerated charge transfer center, the light stability of the device can be effectively improved, but the impact on the mobility of the device is relatively large. By means of simultaneously doping a certain amount of the samarium oxide with a specific proportion of bivalent state, the carrier concentration in the material can be effectively controlled; and by means of enhancing the coupling of rare earth ions and a 2p

TABLE 5

Mobility and NBITS characteristic of device

| | Material | | | | | | | |
|---|---|---|---|---|---|---|---|---|
| | InGaZnO | Sm:InGaZnO | Pr:InGaZnO | | | Pr—Sm:InGaZnO | | |
| | | | m, n | | | | | |
| | m = 0, n = 0 | m = 0.02, n = 0 | m = 0, n = 0.02 | m = 0, n = 0.002 | m = 0.02, n = 0.02 | m = 0.02, n = 0.01 | m = 0.02, n = 0.005 | m = 0.02, n = 0.002 |
| Mobility ($cm^2$/Vs) | 25.2 | 24.5 | 18.6 | 24.4 | 18.1 | 22.3 | 23.5 | 24.5 |
| NBITS ($V_{th}$ shift, V) | −8.5 | −8.4 | −0.5 | −5.2 | −0.1 | −0.2 | −0.3 | −0.4 |

Note

In $In_aM_bR_m R'_nN_c$, M is Ga and Zn; R is Sm; and R' is Pr, where In:Ga:Zn = 2:0.5:1 mol.

It can be learned from Table 5 that, the doping of praseodymium oxide and samarium oxide has remarkable impact on the performance of the device. First, the device prepared by InGaZnO undoped with samarium oxide (m=0)

orbit of oxygen, the doping amount of the praseodymium oxide can be further reduced, so as to achieve good light stability, thereby achieving the high-mobility and high-stability device.

Embodiment 28: Thin-Film Transistor

A group of thin-film transistors uses a back channel etched structure, of which schematic structural diagram is shown in FIG. 1. The thin-film transistor is provided with a substrate 01, a gate electrode 05 located on the substrate 01, an insulation layer 04 located on the substrate 01 and the gate electrode 05, a channel layer 03 covering an upper surface of the insulation layer 04 and corresponding to the gate electrode 05, a source electrode 07-1 and a drain electrode 07-2 that are spaced apart from each other and electrically connected to two ends of the channel layer 03, and a spacing layer 06.

The substrate 01 is a hard alkali-free glass substrate, which is covered with a buffer layer 02 silicon oxide.

A material of the gate electrode 05 is of a Mo/Cu laminated structure prepared by means of magnetron sputtering, with a thickness of 20/400 nm.

The insulation layer 04 is a laminated layer of $Si_3N_4$ and $SiO_2$ prepared by means of chemical vapor deposition, with a thickness of 250/50 nm. The $Si_3N_4$ is at the bottom layer and is in contact with the gate electrode 05, and the $SiO_2$ is at the upper layer and is in contact with the channel layer 03.

In order to test the impact of different components on the performance of the device, the material of the channel layer 03 is the terbium oxide and ytterbium oxide co-doped InGaZnO semiconductor material of Embodiment 14. By means of using four ceramic targets of InGaZnO, terbium oxide doped InGaZnO (Tb:InGaZnO), ytterbium oxide doped InGaZnO (Yb:InGaZnO) and terbium oxide and ytterbium oxide co-doped InGaZnO (Tb—Yb:InGaZnO), and using a single target or co-sputtering of two targets, thin-films with different component proportions can be prepared by adjusting the sputtering power of two targets.

Materials of the source electrode 07-1 and the drain electrode 07-2 are of the Mo/Cu laminated structures, which have a thickness of 20/400 nm. The materials are patterned by using a commercial hydrogen peroxide-based etching solution which has less damage to the channel layer 03 and has no obvious etching residue.

A material of the spacing layer 06 is $SiO_2$ prepared by means of chemical vapor deposition, with a thickness of 300 nm; and a deposition temperature is 250° C.

The thin-film transistor of this embodiment may be an enclosed structure that only includes the substrate 01, the gate electrode 05, the insulation layer 04, the channel layer 03, the source electrode 07-1, the drain electrode 07-2, and the spacing layer 06, or may further include a planarization layer, a reflective electrode, a pixel definition layer, and the like, or may also be integrated with other devices.

The patterning process of the thin-film is performed by means of photolithography, in combination with a wet or dry etching method.

The performance of the device of the thin-film transistor prepared in this embodiment is shown in Table 6. The light-heat negative bias characteristic (NBITS) of the device is characterized by irradiating the channel layer 03 of the device of the thin-film transistor with a commercial white LED light source (luminous intensity being set to 10000 nits). A bias voltage applied to the gate electrode is −30V, and a temperature applied to the substrate is 60° C. By means of evaluating the transfer characteristic under an initial condition, and testing the transfer characteristic of the device after NBITS bias for a certain period of time, changes ($V_{th}$ shift) in the threshold voltage of the device are extracted, so as to evaluate the strength and weakness of light stability. Large changes in the threshold voltage indicate poor light stability, otherwise the opposite.

TABLE 6

Mobility and NBITS characteristic of device

| | Material | | | | | | | |
|---|---|---|---|---|---|---|---|---|
| | InGaZnO | Yb:InGaZnO | Tb:InGaZnO | | | Tb—Yb:InGaZnO | | |
| | | | | | m, n | | | |
| | m = 0, n = 0 | m = 0.006, n = 0 | m = 0, n = 0.01 | m = 0, n = 0.001 | m = 0.006, n = 0.01 | m = 0.006, n = 0.004 | m = 0.006, n = 0.002 | m = 0.006, n = 0.001 |
| Mobility ($cm^2/Vs$) | 38.2 | 35.5 | 25.8 | 36.4 | 24.1 | 28.3 | 33.5 | 35.6 |
| NBITS ($V_{th}$ shift, V) | −12.5 | −10.2 | −0.6 | −8.1 | −0.1 | −0.3 | −0.4 | −0.5 |

Note
In InaMbRm R'nNc, M is Ga and Zn; R is Yb; and R' is Tb, where In:Ga:Zn = 3:1:1 mol.

It can be learned from Table 6 that, the doping of terbium oxide and ytterbium oxide has remarkable impact on the performance of the device. First, the device prepared by InGaZnO undoped with ytterbium oxide (m=0) and terbium oxide (n=0) has relatively high mobility (38.2 $cm^2/Vs$), but has relatively poor NBITS ($V_{th}$ shift=−12.5V), which indicates that the light stability of the device is relatively poor. By means of doping a certain amount of ytterbium oxide (corresponding to m=0.006, n=0), the change in the mobility of the device is little (35.5 $cm^2/Vs$), but the NBITS is still relatively poor ($V_{th}$ shift=−10.2V). Therefore, it indicates that the doping of the ytterbium oxide has little impact on the mobility of the device, but fails to improve the light stability of the device. After a certain amount of terbium oxide (corresponding to m=0, n=0.01) is doped, there is a large degradation in the mobility of the device (25.8 $cm^2/Vs$), but the NBITS is better ($V_{th}$ shift=−0.6V), which indicates that the light stability of the device is better. After a small amount of terbium oxide (corresponding to m=0, n=0.001) is doped, there is little impact on the mobility of the device (36.4 $cm^2/Vs$), but the NBITS of the device is still relatively poor ($V_{th}$ shift=−8.1V), which indicates that the light stability of the device is poor. It is to be noted that, when the doping amount of the ytterbium oxide is maintained to be consistent (m=0.006), and the doping amount of the terbium oxide is changed (n=0.01, 0.004, 0.002, 0.001), the device shows desirable light stability, and the mobility of the device is obviously improved. Therefore, it indicates that even if there is a small amount of terbium oxide is doped, the doping of the ytterbium oxide can effectively improve the light stability of the device, and the impact on the mobility of the device is relatively small.

Figure 9:
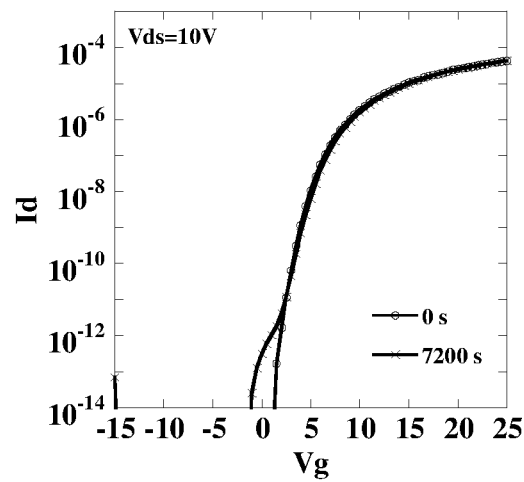
FIG. 9 is an NBITS characteristic diagram of light-heat stability of a device according to Embodiment 28.

Results of the light-heat bias stability NBITS of the device (corresponding to m=0.006, n=0.001) in this embodiment are shown in FIG. 9. After 7200 s of stress testing, the threshold voltage of the device is only negatively shifted by 0.5 V. Therefore, the device shows relatively high mobility and excellent light stability.

Figure 12:
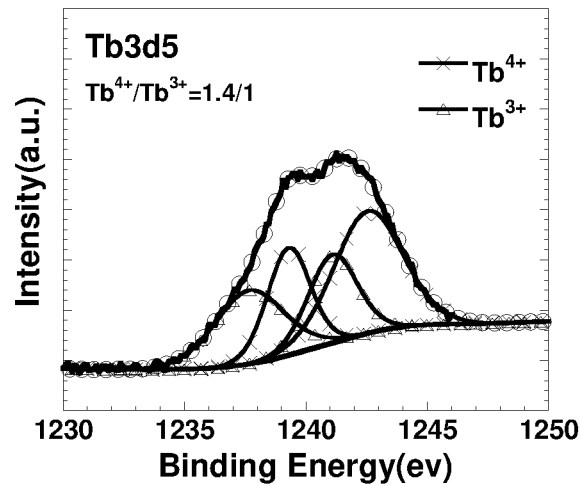
FIG. 12 is a characteristic diagram of a device according to Embodiment 28.

In addition, it can be learned from FIG. 12 that, X-ray photoelectron spectroscopy is performed on the channel layer of the thin-film in this embodiment. Results show that, the ratio of the number of $Tb^{4+}$ ions to the number of $Tb^{3+}$ ions in the thin-film is 1.4/1, which provide a guarantee for the improvement of the light stability of the device.

Test results of this embodiment show that, in the InGaZnO material, by means of doping a certain amount of the terbium oxide with a specific proportion of bivalent state as a photogenerated charge transfer center, the light stability of the device can be effectively improved, but the impact on the mobility of the device is relatively large. By means of simultaneously doping a certain amount of the ytterbium oxide with a specific proportion of bivalent state, the carrier concentration in the material can be effectively controlled; and by means of enhancing the coupling of rare earth ions and a 2p orbit of oxygen, the doping amount of the terbium oxide can be further reduced, so as to achieve good light stability, thereby achieving the high-mobility and high-stability device.

Embodiment 29: Thin-Film Transistor

A group of thin-film transistors uses a top gate electrode self-aligning structure, of which schematic structural diagram is shown in FIG. 2. The thin-film transistor is provided with a substrate 01, a buffer layer 02, a gate electrode 03, an insulation layer 04 and a gate electrode 05 that are located above the channel layer 03, a spacing layer 06 covering upper surfaces of the channel layer 03 and the gate electrode, and a source electrode 07-1 and a drain electrode 07-2 above the spacing layer 06 and electrically connected to two ends of the channel layer 03.

The substrate 01 is a rigid glass substrate.

The buffer layer 02 is $SiO_2$ prepared by means of plasma enhanced chemical vapor deposition.

A material of the channel layer 03 is the praseodymium oxide, europium oxide and thulium oxide co-doped indium zinc oxide semiconductor material of Embodiment 5, with a thickness of 15 nm.

The insulation layer 04 is $SiO_2$, with a thickness of 300 nm. The gate electrode 05 is of a Ti/Cu laminated structure prepared by means of magnetron sputtering, with a thickness of 20/400 nm.

The spacing layer 06 is $SiO_2$, with a thickness of 300 nm.

Materials of the source electrode 07-1 and the drain electrode 07-2 are of the Ti/Cu laminated structure prepared by means of magnetron sputtering, with a thickness of 20/400 nm.

In order to test the impact of different components on the performance of the device, the material of the channel layer 03 is the praseodymium oxide, europium oxide and thulium oxide co-doped indium zinc oxide semiconductor material of Embodiment 17. By means of atomic layer deposition, the thin-film with different component proportions can be prepared by adjusting the number of atom layers of different components.

The thin-film transistor of this embodiment may be an enclosed structure that only includes the substrate 01, the channel layer 03, the insulation layer 04, the gate electrode 05, the spacing layer 06, the source electrode 07-1 and the drain electrode 07-2, or may further include a passivation layer, a pixel definition layer, and the like, or may also be integrated with other devices.

The patterning of the thin-film is performed by means of photolithography, in combination with a wet or dry etching method.

The performance of the device of the thin-film transistor prepared in this embodiment is shown in Table 7. The light-heat negative bias characteristic (NBITS) of the device is characterized by irradiating the channel layer 03 of the device of the thin-film transistor with a commercial white LED light source (light intensity being set to 10000 nits). A bias voltage applied to the gate electrode is −30V, and a temperature applied to the substrate is 60° C. By means of evaluating the transfer characteristic under an initial condition, and testing the transfer characteristic of the device after NBITS bias for a certain period of time, changes ($V_{th}$ shift) in the threshold voltage of the device are extracted, so as to evaluate the strength and weakness of light stability. Large changes in the threshold voltage indicate poor light stability, otherwise the opposite.

TABLE 7

Mobility and NBITS characteristic of device

| | InZnO | Eu—Tm:InZnO | Pr:InZnO | | | Pr—Eu—Tm:InZnO | | |
| --- | --- | --- | --- | --- | --- | --- | --- | --- |
| | | | m, n | | | | | |
| | m = 0, n = 0 | m = 0.03, n = 0 | m = 0, n = 0.03 | m = 0, n = 0.005 | m = 0.03, n = 0.03 | m = 0.03, n = 0.02 | m = 0.03, n = 0.01 | m = 0.03, n = 0.005 |
| Mobility ($cm^2$/Vs) | 46.4 | 44.5 | 27.6 | 44.4 | 25.1 | 33.3 | 40.5 | 43.2 |
| NBITS ($V_{th}$ shift, V) | −15.5 | −12.4 | −1.0 | −10.2 | −0.2 | −0.3 | −0.5 | −0.8 |

Note

In InaMbRmR'nNc, M is Zn; R is Eu and Tm; and R' is Pr, where In:Zn = 5:1 mol, Eu:Tm = 1:1 mol.

It can be learned from Table 7 that, the doping of praseodymium oxide, europium oxide and thulium oxide has remarkable impact on the performance of the device. First, the device prepared by InZnO undoped with europium oxide and thulium oxide (m=0) and praseodymium oxide (n=0) has relatively high mobility (46.4 cm²/Vs), but has relatively poor NBITS ($V_{th}$ shift=−15.5V), which indicates that the light stability of the device is relatively poor. By means of doping a certain amount of europium oxide and thulium oxide (corresponding to m=0.03, n=0), the change in the mobility of the device is little (44.5 cm²/Vs), but the NBITS is still relatively poor ($V_{th}$ shift=−12.4V). Therefore, it indicates that the doping of the europium oxide and the thulium oxide has little impact on the mobility of the device, but fails to improve the light stability of the device. After a certain amount of praseodymium oxide (corresponding to m=0, n=0.03) is doped, there is a large degradation in the mobility of the device (27.6 cm²/Vs), but the NBITS is better ($V_{th}$ shift=−1.0 V), which indicates that the light stability of the device is better. After a small amount of praseodymium oxide (corresponding to m=0, n=0.005) is doped, there is little impact on the mobility of the device (44.4 cm²/Vs), but the NBITS of the device is still relatively poor ($V_{th}$ shift=−10.2V), which indicates that the light stability of the device is poor. It is to be noted that, when the doping amount of the europium oxide and the thulium oxide is maintained to be consistent (m=0.03), and the doping amount of the praseodymium oxide is changed (n=0.03, 0.02, 0.01, 0.005), the device shows desirable light stability, and the mobility of the device is obviously improved. Therefore, it indicates that even if there is a small amount of praseodymium oxide is doped, the doping of the europium oxide and the thulium oxide can effectively improve the light stability of the device, and the impact on the mobility of the device is relatively small.

Figure 10:
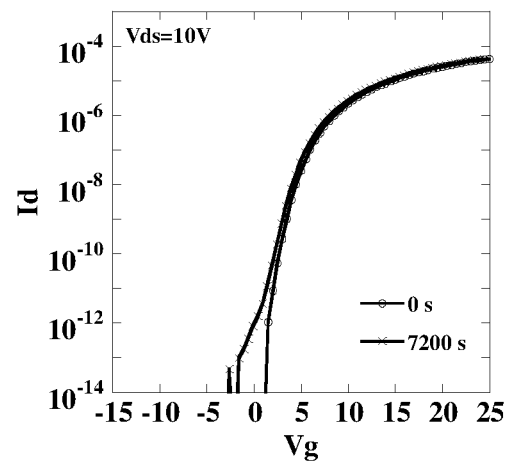
FIG. 10 is an NBITS characteristic diagram of light-heat stability of a device according to Embodiment 29.

Results of the light-heat bias stability NBITS of the device (corresponding to m=0.03, n=0.005) in this embodiment are shown in FIG. 10. After 7200 s of stress testing, the threshold voltage of the device is only negatively shifted by 0.8 V. Therefore, the device shows relatively high mobility and excellent light stability.

Figure 13:
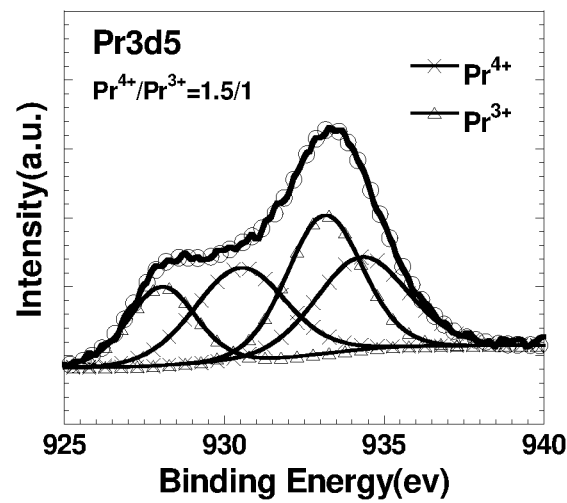
FIG. 13 is a characteristic diagram of a device according to Embodiment 29.

In addition, it can be learned from FIG. 13 that, X-ray photoelectron spectroscopy is performed on the channel layer of the thin-film in this embodiment. Results show that, the ratio of the number of $Pr^{4+}$ ions to the number of $Pr^{3+}$ ions in the thin-film is 1.5/1, which provide a guarantee for the improvement of the light stability of the device.

Test results of this embodiment show that, in the InZnO material, by means of doping a certain amount of the praseodymium oxide with a specific proportion of bivalent state as a photogenerated charge transfer center, the light stability of the device can be effectively improved, but the impact on the mobility of the device is relatively large. By means of simultaneously doping a certain amount of the europium oxide and the thulium oxide with a specific proportion of bivalent state, the carrier concentration in the material can be effectively controlled; and by means of enhancing the coupling of rare earth ions and a 2p orbit of oxygen, the doping amount of the praseodymium oxide can be further reduced, so as to achieve good light stability, thereby achieving the high-mobility and high-stability device.

Embodiment 30: Thin-Film Transistor

Figure 3:
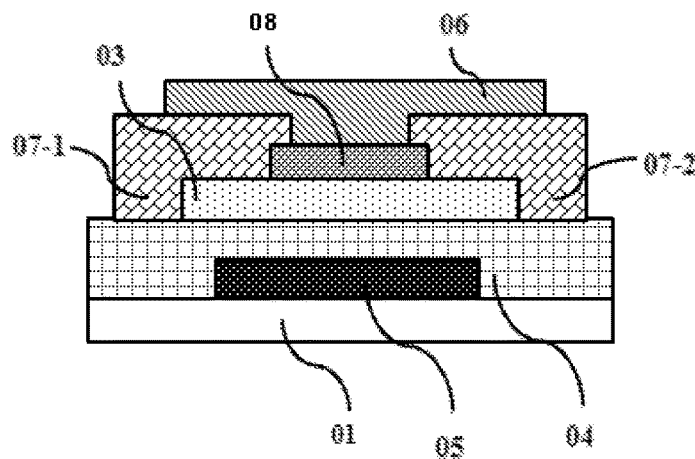
FIG. 3 is a schematic structural diagram of a thin-film transistor according to Embodiment 30.

A group of thin-film transistors uses an etch stop structure, of which schematic structural diagram is shown in FIG. 3. The thin-film transistor is provided with a substrate 01, a gate electrode 05 located on the substrate 01, an insulation layer 04 located on the substrate 01 and the gate electrode 05, a channel layer 03 covering an upper surface of the insulation layer 04 and corresponding to the gate electrode 05, an etch stop layer 08, a source electrode 07-1 and a drain electrode 07-2 that are spaced apart from each other and electrically connected to two ends of the channel layer 03, and a spacing layer 06.

The substrate 01 is a glass substrate, which is covered with a buffer layer 02 silicon oxide.

A material of the gate electrode 05 is of a Mo/Al/Mo laminated structure prepared by means of magnetron sputtering, with a thickness of 50/300/50 nm.

The insulation layer 04 is a laminated layer of Si3N4 and SiO2 prepared by means of chemical vapor deposition, with a thickness of 250/50 nm. The Si3N4 is at the bottom layer and is in contact with the gate electrode 05, and the SiO2 is at the upper layer and is in contact with the channel layer 03.

In order to test the impact of different components on the performance of the device, the material of the channel layer 03 is the praseodymium fluoride and ytterbium fluoride co-doped InGaZnO semiconductor material of Embodiment 18. By means of a solution method, the thin-film with different component proportions can be prepared by adjusting the content of different components.

Materials of the etch stop layer 08 and spacing layer 06 are $SiO_2$ thin-films prepared by means of chemical vapor deposition, with a thickness of 300 nm; and a deposition temperature is 300° C.

Materials of the source electrode 07-1 and the drain electrode 07-2 are of the Mo/Al/Mo laminated structure, with a thickness of 50/300/50 nm.

In addition, the thin-film transistor of this embodiment may be an enclosed structure that only includes the substrate 01, the gate electrode 05, the insulation layer 04, the channel layer 03, the etch stop layer 08, the source electrode 07-1, the drain electrode 07-2, and the passivation layer, or may further include a planarization layer, a reflective electrode, a pixel definition layer, and the like, or may also be integrated with other devices.

The patterning process of the thin-film is performed by means of photolithography, in combination with a wet or dry etching method.

The performance of the device of the thin-film transistor prepared in this embodiment is shown in Table 8. The light-heat negative bias characteristic (NBITS) of the device is characterized by irradiating the channel layer 03 of the device of the thin-film transistor with a commercial white LED light source (luminous intensity being set to 10000 nits). A bias voltage applied to the gate electrode is −30V, and a temperature applied to the substrate is 60° C. By means of evaluating the transfer characteristic under an initial condition, and testing the transfer characteristic of the device after NBITS bias for a certain period of time, changes ($V_{th}$ shift) in the threshold voltage of the device are extracted, so as to evaluate the strength and weakness of light stability. Large changes in the threshold voltage indicate poor light stability, otherwise the opposite.

TABLE 8

Mobility and NBITS characteristic of device

| | Material | | | | | | | |
|---|---|---|---|---|---|---|---|---|
| | InGaZnO | Yb:InGaZnO | Pr:InGaZnO | | Pr—Yb:InGaZnO | | | |
| | | | m, n | | | | | |
| | m = 0, n = 0 | m = 0.001, n = 0 | m = 0, n = 0.01 | m = 0, n = 0.002 | m = 0.001, n = 0.01 | m = 0.001, n = 0.005 | m = 0.001, n = 0.003 | m = 0.001, n = 0.001 |
| Mobility (cm$^2$/Vs) | 20.5 | 19.8 | 15.4 | 19.4 | 15.1 | 16.3 | 17.4 | 18.5 |
| NBITS (V$_{th}$ shift, V) | −6.5 | −4.5 | −0.3 | −5.2 | −0.1 | −0.1 | −0.1 | −0.3 |

Note
In InaMbRm R'nNc, M is Ga and Zn; R is Yb; and R' is Pr, where In:Ga:Zn = 2:1:1 mol.

It can be learned from Table 8 that, the doping of praseodymium oxide and ytterbium oxide has remarkable impact on the performance of the device. First, the device prepared by InGaZnO undoped with ytterbium oxide (m=0) and praseodymium oxide (n=0) has relatively high mobility (20.5 cm$^2$/Vs), but has relatively poor NBITS (V$_{th}$ shift=−6.5V), which indicates that the light stability of the device is relatively poor. By means of doping a certain amount of ytterbium oxide (corresponding to m=0.001, n=0), the change in the mobility of the device is little (19.8 cm$^2$/Vs), but the NBITS is still relatively poor (V$_{th}$ shift=−4.5V). Therefore, it indicates that the doping of the ytterbium oxide has little impact on the mobility of the device, but fails to improve the light stability of the device. After a certain amount of praseodymium oxide (corresponding to m=0, n=0.01) is doped, there is a large degradation in the mobility of the device (15.4 cm$^2$/Vs), but the NBITS is better (V$_{th}$ shift=−0.3V), which indicates that the light stability of the device is better. After a small amount of praseodymium oxide (corresponding to m=0, n=0.002) is doped, there is little impact on the mobility of the device (19.4 cm$^2$/Vs), but the NBITS of the device is still relatively poor (V$_{th}$ shift=−5.2V), which indicates that the light stability of the device is poor. It is to be noted that, when the doping amount of the ytterbium oxide is maintained to be consistent (m=0.001), and the doping amount of the praseodymium oxide is changed (n=0.01, 0.005, 0.003, 0.001), the device shows desirable light stability, and the mobility of the device is obviously improved. Therefore, it indicates that even if there is a small amount of praseodymium oxide is doped, the doping of the ytterbium oxide can effectively improve the light stability of the device, and the impact on the mobility of the device is relatively small.

Figure 11:
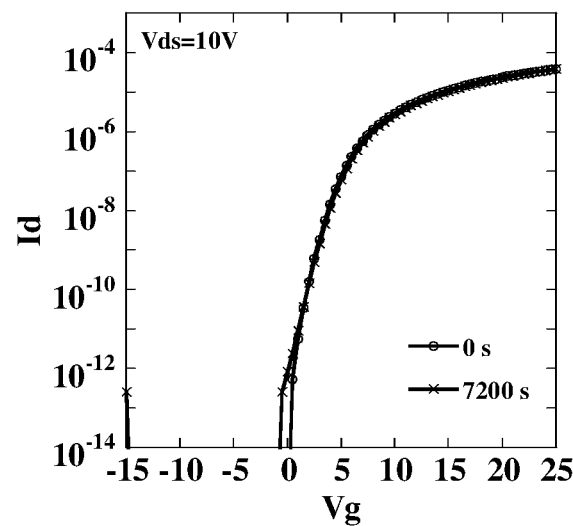
FIG. 11 is an NBITS characteristic diagram of light-heat stability of a device according to Embodiment 30.

Results of the light-heat bias stability NBITS of the device (corresponding to m=0.001, n=0.001) in this embodiment are shown in FIG. 11. After 7200 s of stress testing, the threshold voltage of the device is only negatively shifted by 0.3 V. Therefore, the device shows relatively high mobility and excellent light stability.

Test results of this embodiment show that, in the InGaZnO matrix material, by means of doping a certain amount of the praseodymium oxide with a specific proportion of bivalent state as a photogenerated charge transfer center, the light stability of the device can be effectively improved, but the impact on the mobility of the device is relatively large. By means of simultaneously doping a certain amount of the ytterbium oxide with a specific proportion of bivalent state, the carrier concentration in the material can be effectively controlled; and by means of enhancing the coupling of rare earth ions and a 2p orbit of oxygen, the doping amount of the praseodymium oxide can be further reduced, so as to achieve good light stability, thereby achieving the high-mobility and high-stability device.

Embodiment 31: Display Panel

A display panel includes the thin-film transistor in Embodiments 15 to 18. The thin-film transistor is configured to drive a display unit in the display panel.

Embodiment 32: Detector

A detector includes the thin-film transistor in Embodiments 15 to 18. The thin-film transistor is configured to drive a detection unit of the detector.

Each functional layer of the thin-film transistor implemented in the present invention is further described below.

There is no specific limitation to the substrate in the present invention; and the substrate 01 well known in the art can be used, for example, hard alkali glass, alkali-free glass, quartz glass and a silicon substrate. The substrate may also be flexible Polyimide (PI), Polyethylene Naphthalate (PEN), Polyethylene Terephthalate (PET), Polyethylene (PE), Polypropylene (PP), Polystyrene (PS), Polyether Sulfone (PES) or a sheet metal.

The gate electrode 05 in the present invention is not specifically limited, which may be randomly selected from materials well known in the art, such as transparent conductive oxide (ITO, AZO, GZO, IZO, ITZO, FTO, and the like), metals (Mo, Al, Cu, Ag, Ti, Au, Ta, Cr, Ni, and the like) and alloy thereof, and a composite conductive thin-film that is formed by disposing metals and oxides (ITO/Ag/ITO, IZO/Ag/IZO, and the like) or metals and metals (Mo/Al/Mo, Ti/Al/Ti, and the like) in a stacked manner.

The gate electrode 05 thin-film can be prepared by means of sputtering, electroplating, heat evaporation and other deposition methods, preferably, the sputtering deposition, because the thin-film and the substrate 01 prepared by means of sputtering deposition are good in adhesion and excellent in uniformity, and can be prepared in large scale.

Herein, the specific structure of a gate electrode needs to be determined according to technical parameters to be achieved. For example, a transparent electrode is needed in transparent display, which can use single-layer ITO as a gate electrode, or use ITO/Ag/ITO as the gate electrode. In addition, applications in special field require high-temperature processes, and then the gate electrode can be selected from metal alloy thin-films that can resist high temperatures.

The material of the insulation layer 04 in the present invention is not specifically limited, which may be randomly selected from materials well known in the art, such as silicon oxide, silicon nitride, aluminum oxide, tantalum oxide, hafnium oxide, yttrium oxide, and polymer organic film layers.

It is to be noted that, the components of these insulation thin-films can be inconsistent with a theoretical stoichiometric ratio. In addition, the insulation layer 04 may be formed by stacking various insulation films. In an aspect, better insulation characteristics can be formed, and in another aspect, the interfacial characteristics of the channel layer 03 and the insulation layer 04 can be improved. Furthermore, the insulation layer 04 can be prepared in various ways, such as physical vapor deposition, chemical vapor deposition, atomic layer deposition, laser deposition, anodic oxidation or the solution method.

An etching solution used for wet etching includes: a mixed solution of phosphoric acid, nitric acid and glacial acetic acid or a mixed solution based on hydrogen peroxide. The etching rate of the MO semiconductor material in the hydrogen peroxide-based etching solution is less than 1 nm/min. Exemplarily, dry etching may select a plasma etching process; and etching gases include chlorine-based or fluorine-based gases.

A vacuum magnetron sputtering process for the MO semiconductor material may select sputtering of single target materials or co-sputtering of a plurality of target materials, preferably the sputtering of single target materials.

This is because the sputtering of single target materials can provide a better reproducible and more stable thin-film, and the microstructure of the thin-film is easier to control, unlike in co-sputtered thin-films where sputtered particles are disturbed by more factors during a process of recombination.

During vacuum sputtering deposition, a power supply can be selected from Radio Frequency (RF) sputtering, Direct Current (DC) sputtering or Alternating Current (AC) sputtering, and the AC sputtering is commonly preferred in industry.

During sputtering deposition, a sputtering pressure is optionally 0.1 Pa-10 Pa, preferably 0.3 Pa-0.7 Pa.

When the sputtering pressure is too low, stable glow sputtering cannot be maintained; when the sputtering pressure is too high, sputtered particles are subjected to significantly increased scattering during deposition to the substrate 01, resulting in increased energy loss, reduced kinetic energy upon reaching the substrate 01, and increased defects in the formed thin-film, thereby seriously affecting the performance of the device.

During sputtering deposition, an oxygen partial pressure is optionally 0-1 Pa, preferably 0.001-0.5 Pa, and more preferably 0.01-0.1 Pa.

Generally, during a process of preparing an oxide semiconductor by means of sputtering, the oxygen partial pressure directly affects the carrier concentration of the thin-film, and some defects related to oxygen vacancies are introduced. Too low oxygen content may cause a severe oxygen mismatch in the thin-film and an increase in the carrier concentration; and excessive oxygen vacancies may cause more weak binding bonds, which may reduce the reliability of the device.

During sputtering deposition, a substrate temperature is preferably 200-300° C.

During deposition of the channel layer thin-film, a certain substrate temperature can effectively improve the bonding mode of the sputtered particles after reaching the substrate 01, such that the odds of existence of weak binding bonds can be reduced, and the stability of the device can be improved. Definitely, the same effect can be achieved by means of subsequent annealing processes.

The thickness of the channel layer 03 is optionally 2-100 nm, preferably 5-50 nm, and more preferably 20-40 nm.

The source electrode/drain electrode materials in the present invention are not specifically limited, which may be randomly selected from materials well known in the art without affecting the implementation of various required structural devices, such as transparent conductive oxide (ITO, AZO, GZO, IZO, ITZO, FTO, and the like), metals (Mo, Al, Cu, Ag, Ti, Au, Ta, Cr, Ni, and the like) and alloy thereof, and a composite conductive thin-film that is formed by disposing metals and oxides (ITO/Ag/ITO, IZO/Ag/IZO, and the like) or metals and metals (Mo/Al/Mo, Ti/Al/Ti, and the like) in a stacked manner.

The source electrode/drain electrode thin film can be prepared by means of sputtering, heat evaporation and other deposition methods, preferably, the sputtering deposition, because the thin film and the substrate 01 prepared by means of sputtering deposition are good in adhesion and excellent in uniformity, and can be prepared in large scale.

Herein, it is to be specifically noted that, in preparation of the device of the back channel etched structure, an appropriate etching selection ratio is required between source electrode/drain electrode and the channel layer 03. The etching solution for wet etching in this embodiment of the present invention is based on the etching solution of conventional metals in industry (for example, hydrogen peroxide-based etching solution), this is mainly because a MO semiconductor material of the present invention can effectively resist the etching of the wet hydrogen peroxide-based etching solution, which has a high etching selection ratio with metals (such as molybdenum, molybdenum alloy, molybdenum/aluminum/molybdenum, and the like). The MO semiconductor layer is basically unaffected by the etching solution, and the prepared device has excellent performance and good stability. In addition, dry etching in this embodiment of the present invention is based on conventional etching gases in industry (for example, chlorine-based gases, fluorine-based gases, and the like), which have little impact on the oxide semiconductor layer of the invention, and the devices prepared have excellent performance and good stability.

The material of the passivation layer in the present invention is not specifically limited, which may be randomly selected from materials well known in the art, such as silicon oxide, silicon nitride, aluminum oxide, tantalum oxide, hafnium oxide, yttrium oxide, and polymer organic film layers.

It is to be noted that, the components of these insulation thin-films can be inconsistent with a theoretical stoichiometric ratio. In addition, the insulation layer 04 may be formed by stacking various insulation films. In an aspect, better insulation characteristics can be formed, and in another aspect, the interfacial characteristics of the channel layer 03 and the passivation layer can be improved. Furthermore, the passivation layer can be prepared in various ways, such as physical vapor deposition, chemical vapor deposition, atomic layer deposition, laser deposition, or the solution method.

Processing processes during a process of preparing the thin-film transistor implemented in the present invention are further described below.

In contrast, the thin-film prepared by means of sputtering is generally deposited at a fast rate due to the participation of high-energy plasma; and the thin-film does not have enough time to execute a relaxation process during deposition, which may cause a certain proportion of misalignment and residual stress in the thin-film. A heat annealing treatment is required subsequently, so as to continue to achieve a required relative steady state and improved the performance of the thin-film.

In the implementation of the present invention, the annealing treatment is mostly set after the deposition of the channel layer 03 and after the deposition of the passivation layer. In an aspect, the annealing treatment is performed after the deposition of the channel layer 03, such that in situ defects in the channel layer 03 can be effectively improved, and the ability of the channel layer 03 to resist possible damage in subsequent processes can be enhanced. In another aspect, in a subsequent process of deposition of the passivation layer, this may require an "activation" process due to the participation of the plasma and the modification of active groups, so as to further eliminate interfacial states and some effects such as donor doping.

In addition, in the implementation of the present invention, processing manners can be more than just heating, but can include processing interfaces (such as an interface of the insulation layer 04/the semiconductor, an interface of the channel layer 03/the passivation layer, and the like) by means of plasma.

By means of the above processing processes, the performance of the device can be effectively improved, and the stability of the device can be enhanced.

The above embodiments are preferred embodiments of the present invention, but the embodiments of the present invention are not limited by the above embodiments, and any other changes, modifications, substitutions, combinations, and simplifications that do not deviate from the spirit and principle of the present invention should be equivalent substitutions and are included within the protection scope of the present invention.

What is claimed is:

1. A rare-earth doped semiconductor material, wherein the semiconductor material is that, compounds of at least two rare-earth elements R and R' are respectively doped into an indium oxide containing material, so as to form an $In_aM_bR_mR'_nD_c$ semiconductor material, wherein $0.53 \leq a < 0.9999$, $0 \leq b < 0.5$, $0.0001 \leq (m+n) \leq 0.1$, $a+b+m+n=1$, $m>0$, $n>0$, and $c>0$; the rare-earth element R is one of samarium, europium, thulium or ytterbium or a combination of any two or more of the above; the rare-earth element R' is one of praseodymium or terbium or a combination of the above two materials; D is an oxygen element; M is one of Zn, Ga, Sn, Ge, Sb, Mg, Ti, Zr, Hf, Ta, or W or a combination of any two or more of the above materials; the valence state of the ion compound of R is +2 and +3; the valence state of the ion compound of R' is +3 and +4; the ratio of the number of +3-valent ions to the number of +2-valent ions in the ion compound of R is greater than 1.0; and the ratio of the number of +4-valent ions to the number of +3-valent ions in the ion compound of R' is greater than 1.2.

2. The rare-earth doped semiconductor material as claimed in claim 1, wherein in the $In_aM_bR_mR'_nD_c$ semiconductor material, D is an oxygen element and additionally comprises one of fluorine, chlorine, sulfur, selenium, tellurium, bromine, or iodine or a combination of any two or more of the above.

3. The rare-earth doped semiconductor material as claimed in claim 1, wherein in the $In_aM_bR_mR'_nD_c$ semiconductor material, D is an oxygen element and additionally comprises one of boron, carbon, nitrogen, silicon, or phosphorus or a combination of any two or more of the above.

4. The rare-earth doped semiconductor material as claimed in claim 1, wherein in the $In_aM_bR_mR'_nD_c$ semiconductor material, $0.001 \leq (m+n) \leq 0.05$, and m/n is greater than 1.0.

* * * * *